(12) United States Patent
Cheng et al.

(10) Patent No.: US 8,821,978 B2
(45) Date of Patent: Sep. 2, 2014

(54) METHODS OF DIRECTED SELF-ASSEMBLY AND LAYERED STRUCTURES FORMED THEREFROM

(75) Inventors: Joy Cheng, San Jose, CA (US); William D. Hinsberg, Fremont, CA (US); Hiroshi Ito, San Jose, CA (US); Atsuko Ito, legal representative, San Jose, CA (US); Ho-Cheol Kim, San Jose, CA (US); Young-Hye Na, San Jose, CA (US); Daniel Paul Sanders, San Jose, CA (US); Linda Karin Sundberg, Los Gatos, CA (US); Hoa D. Truong, San Jose, CA (US); Gregory Michael Wallraff, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 651 days.

(21) Appl. No.: 12/641,959

(22) Filed: Dec. 18, 2009

(65) Prior Publication Data

US 2011/0147983 A1   Jun. 23, 2011

(51) Int. Cl.
  *B32B 3/10* (2006.01)
  *G03F 7/16* (2006.01)
  *G03F 7/38* (2006.01)
  *G03F 7/40* (2006.01)
  *G03F 7/30* (2006.01)

(52) U.S. Cl.
  USPC ........... 427/259; 427/258; 427/261; 427/264; 427/270; 427/271; 427/272; 427/282; 430/322; 430/323; 430/324; 430/325; 430/326; 430/327; 430/328; 430/329; 430/330

(58) Field of Classification Search
  None
  See application file for complete search history.

(56) References Cited

U.S. PATENT DOCUMENTS

| 6,746,825 | B2 | 6/2004 | Nealey et al. |
| 6,900,001 | B2 | 5/2005 | Livesay et al. |
| 6,926,953 | B2 | 8/2005 | Nealey et al. |
| 7,008,757 | B2 | 3/2006 | Reichmanis et al. |
| 7,347,953 | B2 | 3/2008 | Black et al. |
| 7,521,090 | B1 | 4/2009 | Cheng et al. |
| 7,521,094 | B1 | 4/2009 | Cheng et al. |

(Continued)

FOREIGN PATENT DOCUMENTS

| JP | 2001343757 | 12/2001 |
| WO | 2008097736 A2 | 8/2008 |

OTHER PUBLICATIONS

Mansky et al., "Controlling Polymer-Surface Interactions with Random Copolymer Brushes", Science, vol. 275, (Mar. 7, 1997), pp. 1458-1460.*

(Continued)

*Primary Examiner* — Michael Cleveland
*Assistant Examiner* — Lisha Jiang
(74) *Attorney, Agent, or Firm* — Michael R. Roberts

(57) ABSTRACT

A method of forming a layered structure comprising a domain pattern of a self-assembled material utilizes a negative-tone patterned photoresist layer comprising non-crosslinked developed photoresist. The developed photoresist is not soluble in an organic casting solvent for a material capable of self-assembly. The developed photoresist is soluble in an aqueous alkaline developer and/or a second organic solvent. A solution comprising the material capable of self-assembly and the organic casting solvent is casted on the patterned photoresist layer. Upon removal of the organic casting solvent, the material self-assembles, thereby forming the layered structure.

29 Claims, 20 Drawing Sheets

(56) References Cited

U.S. PATENT DOCUMENTS

| | | | |
|---|---|---|---|
| 2002/0128408 A1* | 9/2002 | Goodall et al. | 526/171 |
| 2003/0022111 A1* | 1/2003 | Falk et al. | 430/322 |
| 2003/0047533 A1* | 3/2003 | Reid et al. | 216/24 |
| 2003/0091752 A1 | 5/2003 | Nealey et al. | |
| 2004/0029047 A1 | 2/2004 | Ishibashi et al. | |
| 2004/0175628 A1 | 9/2004 | Nealey et al. | |
| 2005/0158988 A1 | 7/2005 | Lee et al. | |
| 2005/0227492 A1 | 10/2005 | Hah et al. | |
| 2006/0121076 A1* | 6/2006 | Ranade et al. | 424/422 |
| 2006/0134556 A1 | 6/2006 | Nealey et al. | |
| 2007/0134420 A1 | 6/2007 | Koberstein et al. | |
| 2007/0134939 A1* | 6/2007 | Brueck et al. | 438/778 |
| 2007/0175859 A1* | 8/2007 | Black et al. | 216/41 |
| 2008/0070010 A1 | 3/2008 | Dravid et al. | |
| 2008/0085601 A1 | 4/2008 | Park et al. | |
| 2008/0131820 A1* | 6/2008 | Van Steenwinckel et al. | 430/325 |
| 2008/0193658 A1 | 8/2008 | Millward | |
| 2008/0199814 A1 | 8/2008 | Brzozowy et al. | |
| 2009/0035668 A1 | 2/2009 | Breyta et al. | |
| 2009/0239086 A1* | 9/2009 | Ishizuka et al. | 428/447 |
| 2010/0167214 A1* | 7/2010 | Yoon et al. | 430/323 |
| 2011/0052883 A1* | 3/2011 | Jain et al. | 430/323 |

OTHER PUBLICATIONS

European Patent Office, PCT/EP2010/068316, filed Nov. 26, 2010, Written Opinion and International Search Report, mailing date Mar. 29, 2011.

Jeong, et al., "Soft Graphoepitaxy of Block Copolymer Assembly with Disposable Photoresist Confinement," Nanoletters, 2009, vol. 9, No. 6 2300-2305, Published on Web May 7, 2009.

Jeong, et al., Supplement to "Soft Graphoepitaxy of Block Copolymer Assembly with Disposable Photoresist Confinement," Nanoletters, 2009, vol. 9, No. 6 2300-2305, Published on Web May 7, 2009.

Park, et al., "Block copolymer multiple patterning integrated with conventional ArF lithography," Soft Matter, 2010, 6, 120-125, First published as an Advance Article on the web Sep. 17, 2009.

Tarutani, et al., "Development of materials and processes for double patterning toward 32-nm node 193-nm immersion lithography process," Proc. of SPIE vol. 6923, pp. 69230F-1 to 69230F-8, Feb. 25, 2008.

Tarutani, et al., "Development of materials and processes for negative tone development toward 32-nm node 193-nm immersion double-patterning process," Proc. of SPIE vol. 7273, pp. 72730C-1-72730C-8, Sep. 23, 2009.

"Nanostructure engineering by templated self-assembly of block copolymers" J.Y. Cheng; A.M. Mayes; Caroline A. Ross, Nature Materials, Nov. 2004, vol. 3, pp. 823-828, Oct. 3, 2004.

"Polymer self assembly in simiconductor microelectronics" Black et al., IBM J. Res. Dev., Sep. 2007, vol. 51, pp. 605-633.

"Block copolymers and conventional lithography" M.P. Stoykovich; P.F. Nealey, Materials Today, Sep. 2006, vol. 9, pp. 20-29.

"Directed Self-Assembly of Block Copolymers for Nanolithography: Fabrication of Isolated Features and Essential Integrated Circuit Geometries" M.P. Stoykovich et al., ACS Nano, vol. 1, No. 3, pp. 168-175, (2007).

"Templated Self-Assembly of Block Copolymers: Top-Down Helps Bottom-Up" J.Y. Cheng; C.A. Ross; H.I Smith; E.L. Thomas, Adv. Materials, 2006, 18, pp. 2505-2521.

"Patterned Magnetic Media Made by Self-Assembled Block-Copolymer Lithography" C.A. Ross; J.Y. Cheng, MRS Bull., Sep. 2008, vol. 33, pp. 838-845.

"Surface patterns from block copolymer self-assembly" H.C. Kim; W.D. Hinsberg, J. Vac. Sci. Technol. A, Nov./Dec. 2008, 26, pp. 1369-1382.

\* cited by examiner

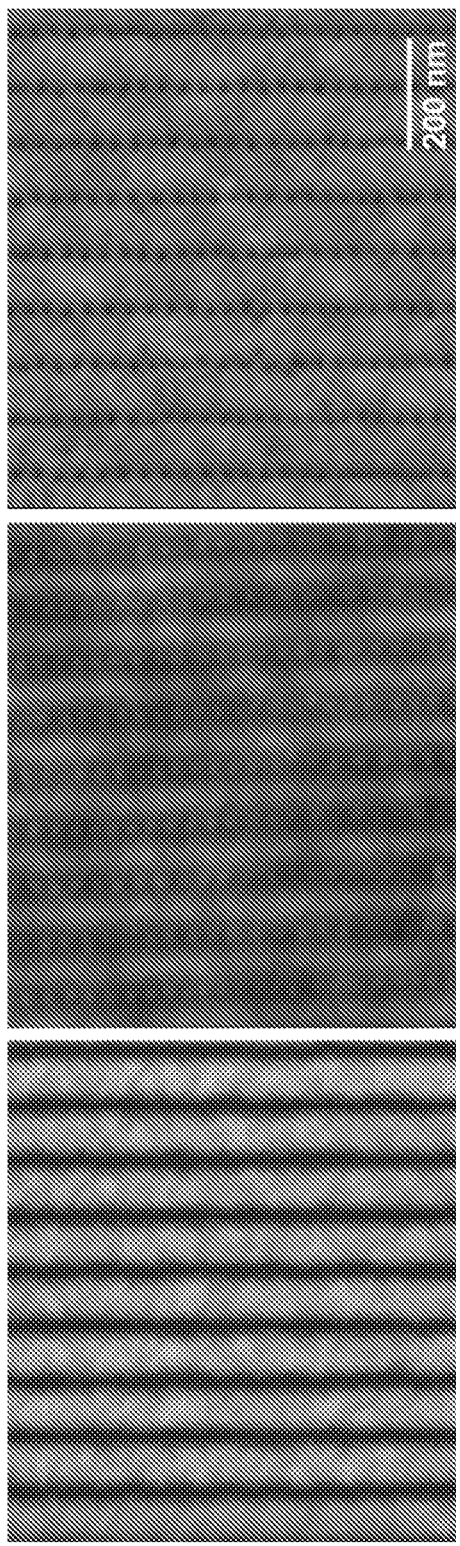

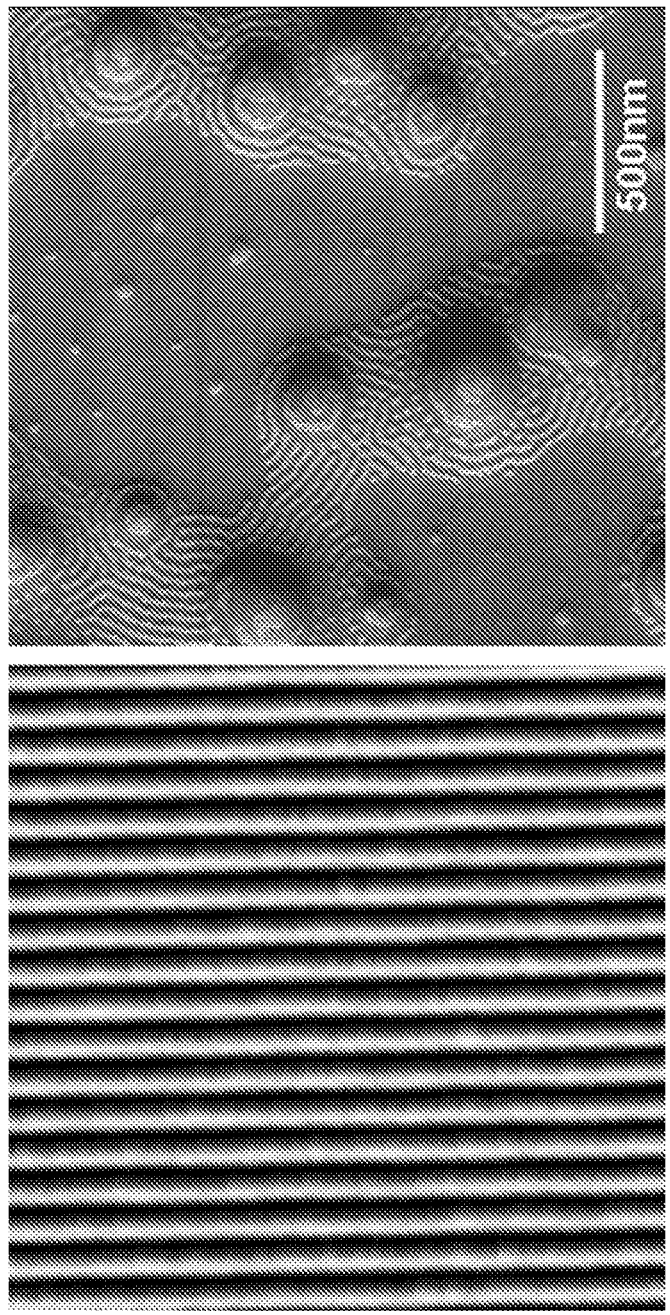

METHODS OF DIRECTED SELF-ASSEMBLY AND LAYERED STRUCTURES FORMED THEREFROM

BACKGROUND

The invention relates to methods of directed self-assembly to form layered structures and more specifically, to the use of non-crosslinking photoresists developed using a non-alkaline solvent for directed polymer self-assembly.

Patterning features with smaller critical dimensions at tighter pitches allows denser circuitry to be created, and therefore can reduce overall production cost and improve device performance. Directed polymer self-assembly (DSA) is a potential candidate to extend current lithography by enhancing the spatial resolution and/or controlling the critical dimension variation of a predefined pattern on a substrate. There are two methods for implementing DSA: graphoepitaxy and chemical epitaxy. In a graphoepitaxial DSA technique, self-assembly (SA) of a material (e.g., a polymer) is guided by topographical features and their surface properties in lithographically pre-patterned substrates. In a chemical epitaxy DSA technique, self-assembly of a material is guided by lithographically defined chemical pre-patterns on a substrate surface. Two major challenges impeding integration of DSA into standard lithographic processes are non-compatibility of a patterned photoresist to the casting solvent used with SA materials and inability of the underlying substrate to support a specific SA morphology.

DSA pre-patterns for graphoepitaxy are typically generated in a hard mask layer (for example, silicon oxide) to prevent the solvent used in casting the self-assembly material (SA material) from dissolving the pre-pattern. The use of hard mask pre-patterns adds process complexity, as shown in the series of steps in FIG. 1A to 1D (Prior Art) using schematic layer diagrams. First, a hard mask layer 202 is deposited on a bottom layer 200 (e.g., silicon wafer or transfer layer), followed by a photoresist layer 204 (FIG. 1A). Patterning the photoresist layer in a lithographic process produces a photoresist pattern 206 (FIG. 1B). If the hard mask layer 202 does not also serve as an anti-reflective coating (ARC), a separate ARC layer can be applied to the substrate prior to the photoresist. The photoresist pattern 206 comprising trench area 208 is then transferred into the hard mask layer 202 by an additive or subtractive process, after which the photoresist is stripped, leaving a hard mask pre-pattern 210 (FIG. 1C) for self-assembly. Hard mask pre-pattern 210 includes all surfaces (e.g., surfaces 203, 205, and 207 in FIG. 1C) formed or uncovered by etching the hard mask layer and removing the photoresist pattern. If desired, the surface of the hard mask pre-pattern 210 can be further modified prior to applying a material for self-assembly. For example, a polymer can be chemically grafted onto the surface of the hard mask pre-pattern 210 to provide the appropriate surface properties for the hard mask pre-pattern 210 to guide the subsequent self-assembly process. In particular, such a modification of the hard mask pre-pattern 210 can be used to control the affinity of the pre-pattern for particular domains of the SA material. A SA material is then cast from a solvent onto the hard mask pre-pattern 210 to form layer 212, in this case allocating the SA material substantially in trench 208. The hard mask pre-pattern topographically directs the self-assembly of the SA material, to form ordered domains 214 and 216 in the trench areas 208 (FIG. 1D). The additional steps needed to generate a hard mask pre-pattern and modify its surface properties increase the cost of the DSA process.

In the chemical epitaxy technique, DSA chemical pre-patterns for chemical epitaxy are typically made from a two-layer stacked structure in a multi-step process. The two-layer stack consists of a photoresist layer disposed on a substrate. First, a topographic pattern is generated by imaging and developing the photoresist layer, uncovering a surface of the underlying substrate. Second, the uncovered surface of the substrate is damaged by exposure to plasma through the openings in the photoresist layer, causing a change in a surface property of the uncovered surface of the substrate. Third, the photoresist is removed to produce a chemically patterned surface for DSA consisting of damaged and undamaged surface regions of the substrate. Chemical epitaxy is also challenged by high cost and process complexity by introducing a functional underlying surface that can be damaged during the pattern transfer step.

Alternatively, a negative-tone photoresist that crosslinks and becomes less soluble in developer solvent in the exposed regions can be employed to create pre-patterns suitable for chemical epitaxy. For example, a thin layer of a crosslinking negative-tone photoresist (such as hydrogen silsesquioxane (HSQ)) is disposed on a substrate comprising a suitable surface for self-assembly. Then a chemically patterned surface is created by imaging the thin layer of crosslinking negative-tone photoresist and removing the non-crosslinked material (e.g., the photoresist in the non-exposed regions). In such a process, the thickness of the crosslinking negative-tone photoresist must be less than the thickness of the layer of the SA material in order to direct the self-assembly process by chemical rather than by topographical means.

Solvent non-compatibility and underlayer non-compatibility present major obstacles to integrating DSA directly into a standard lithographic process. The photoresist patterns formed after exposure and development of standard positive-tone photoresists are soluble in many organic solvents. High solubility of the patterned photoresist in the solvents used to apply the SA material, or interaction with the solvents, limits the utility of standard positive-tone photoresists in DSA (e.g., the solution of SA materials dissolves or collapses the photoresist pattern). A surface having controlled affinity for the various domains formed during self-assembly is necessary for controlling the orientation of the self-assembled structures; however, chemical reactions initiated by the imaging process and/or the subsequent bake and development processes have a high probability of altering the surface property of the underlayer and rendering the underlayer incompatible with the desired DSA morphology. For example, patterning a conventional positive-tone photoresist using a conventional aqueous tetramethylammonium hydroxide (TMAH) developer on top of an underlying surface can detrimentally impact the underlying surface properties responsible for the controlled affinity. Alternatively, a chemical "freezing" agent or surface curing agent can be used to render a non-crosslinked photoresist pattern insoluble in the solvent used for casting a SA material; however, these chemical treatments can also react with the underlayer to damage or change its surface properties. In addition, such chemical treatments constitute additional process steps, and can induce a dimensional change in the photoresist pattern. As mentioned previously, DSA will not work properly without the appropriate underlayer surface property.

A negative-tone photoresist that crosslinks and becomes less soluble in developer solvent in the exposed regions can be employed to produce photoresist patterns that will not dissolve in typical casting solvents used to apply SA materials. Unfortunately, negative-tone photoresists have historically offered limited resolution and suffered from poor profiles, microbridging, and/or swelling in organic solvents. Furthermore, some patterns can be difficult to image using a negative-tone mask. Finally, frozen positive-tone photoresist patterns and crosslinked negative-tone photoresist patterns are difficult to rework.

Therefore, new methods are needed for generating topographical or chemical pre-patterns for DSA that have fewer process steps, that have less risk of damaging the underlayer, and that preserve desirable underlayer surface properties.

SUMMARY

Accordingly, methods of forming layered structures utilize a patterned photoresist derived from a non-crosslinking, positive-tone photoresist, which is developed in a non-alkaline developer, for directing self-assembly by either graphoepitaxy or chemical epitaxy.

In a first embodiment, a method of forming a layered structure comprising a domain pattern of a self-assembled material comprises:

disposing on a substrate a photoresist layer comprising a non-crosslinking photoresist; optionally baking the photoresist layer; pattern-wise exposing the photoresist layer to first radiation; optionally baking the exposed photoresist layer; and developing the exposed photoresist layer with a non-alkaline developer to form a negative-tone patterned photoresist layer comprising non-crosslinked developed photoresist; wherein the developed photoresist is not soluble in a given organic solvent suitable for casting a given material capable of self-assembly, and the developed photoresist is soluble in an aqueous alkaline developer and/or a second organic solvent;

casting a solution comprising the given material capable of self-assembly dissolved in the given organic solvent on the patterned photoresist layer, and removing the given organic solvent; and allowing the casted given material to self-assemble while optionally heating and/or annealing the casted given material, thereby forming the layered structure comprising the domain pattern of the self-assembled given material.

In a second embodiment, a method of forming a layered structure comprising a relief pattern derived from a self-assembled polymer comprises:

disposing on an anti-reflection surface of a substrate a photoresist layer comprising a non-crosslinking photoresist capable of chemical amplification; optionally baking the photoresist layer; pattern-wise exposing the photoresist layer to first radiation; optionally baking the exposed photoresist layer; and developing the exposed photoresist layer with a non-alkaline developer to form a negative-tone patterned photoresist layer comprising non-crosslinked developed photoresist, wherein the developed photoresist is soluble in a given organic solvent suitable for casting a given polymer capable of self-assembly;

treating the patterned photoresist layer photochemically, thermally and/or chemically to form a treated patterned photoresist layer comprising non-crosslinked treated photoresist, wherein the treated photoresist is not soluble in the given organic solvent suitable for casting the given polymer capable of self-assembly, and wherein the treated photoresist is soluble in an aqueous alkaline developer and/or a second organic solvent;

casting a solution of the given polymer dissolved in the given organic solvent on the treated patterned photoresist layer and removing the given organic solvent;

allowing the casted given polymer to self-assemble while optionally heating and/or annealing the casted given polymer, thereby forming a domain pattern of the self-assembled given polymer, the domain pattern comprising a first domain and a second domain; and selectively removing the first domain, while leaving behind a second domain of the self-assembled given polymer, thereby forming the layered structure comprising the relief pattern.

In a third embodiment, a method of forming a layered structure having a relief pattern derived from a self-assembled block copolymer comprises:

disposing on an anti-reflection surface of a substrate a photoresist layer comprising a non-crosslinking photoresist capable of chemical amplification; optionally baking the photoresist layer; pattern-wise exposing the photoresist layer to first radiation; optionally baking the exposed photoresist layer; developing the photoresist layer with a non-alkaline developer to form a negative-tone patterned photoresist layer comprising non-crosslinked developed photoresist, wherein the developed photoresist is soluble in a given organic solvent suitable for casting a given block copolymer capable of self-assembly;

thermally treating the patterned photoresist layer at a temperature of 60° C. to 300° C. for at least 1 sec to form a treated patterned photoresist layer comprising non-crosslinked treated photoresist, wherein the treated photoresist is not soluble in the given organic solvent suitable for casting the given block copolymer capable of self-assembly, and the treated photoresist is soluble in an aqueous alkaline developer and/or a second organic solvent;

casting the given block copolymer dissolved in the given organic solvent on the treated patterned photoresist layer, and removing the given organic solvent;

allowing the casted given block copolymer to self-assemble while optionally heating and/or annealing the casted given block copolymer, to form a domain pattern of the self-assembled given block copolymer, the domain pattern comprising a first domain and a second domain; and selectively removing the first domain, while leaving behind the second domain, thereby forming the layered structure comprising the relief pattern.

In a fourth embodiment, a method for creating a layered structure from a self-assembled polymer comprises:

forming a layer of a non-crosslinking photoresist capable of chemical amplification on a substrate that includes a surface suitable for self-assembly of a polymer; pattern-wise exposing the photoresist with radiation; optionally, baking the photoresist, wherein through the actions of exposing and optionally baking, the exposed portions of the photoresist are rendered insoluble in both a non-alkaline developing solvent and a given casting solvent suitable for a given polymer capable of self-assembly;

selectively removing the photoresist in non-exposed regions using the non-alkaline developing solvent, thereby forming a patterned photoresist layer;

optionally, baking the patterned photoresist layer;

casting a solution of the given polymer dissolved in the given casting solvent on the patterned photoresist layer; removing the solvent; and with optional annealing allowing the casted given polymer to self-assemble; and selectively removing a self-assembled domain of the given self-assembled polymer to form a relief pattern.

The above-described and other features and advantages of the present invention will be appreciated and understood by those skilled in the art from the following detailed description, drawings, and appended claims.

BRIEF DESCRIPTION OF THE SEVERAL VIEWS OF THE DRAWINGS

In the drawings, like elements are numbered alike.

FIG. 8A is an AFM height image of the layered structure in Example 1 before a layer of SA material is disposed on the photoresist pre-pattern.

FIG. 8B is an AFM height image of the layered structure in Example 1 after a layer of SA material is disposed on the photoresist pre-pattern and the SA material has self-assembled to form ordered domains.

FIG. 8C is an AFM height image of the etched layered structure in Example 1. A layer of SA material is disposed on the photoresist pre-pattern and the uncovered minority domains (PMMA domains in this example) are selectively removed by oxygen plasma to leave holes in the trench. The darker areas represent the holes.

FIGS. 12A and 12B depict thickness of the developed photoresist layer in angstroms plotted against exposure in $mJ/cm^2$ after anisole development, after the thermal treatment (labeled "175C Bake" in the legend), after 10 sec or 30 sec PGMEA rinse of the thermally treated photoresist, and after developing the thermally treated photoresist in aqueous tetramethylammonium hydroxide (TMAH).

FIG. 16A is an AFM height image of the layered structure in Comparative Example 2 showing the photoresist layer before casting the SA layer.

FIG. 16B is an AFM phase image of the layered structure in Comparative Example 2 after casting the SA material in PGMEA, and baking the SA layer. The photoresist pattern was dissolved by the PGMEA.

DETAILED DESCRIPTION

Figure 1A:
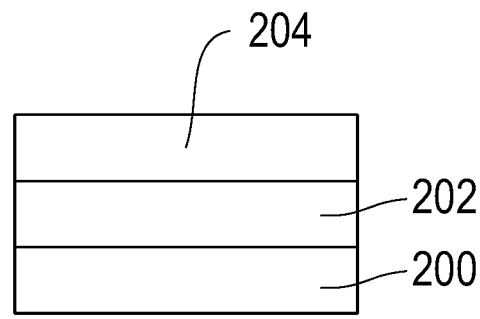
FIGS. 1A to 1D are schematic layer diagrams showing the method by which graphoepitaxy is typically implemented using a hard mask (Prior Art).
Figure 1B:
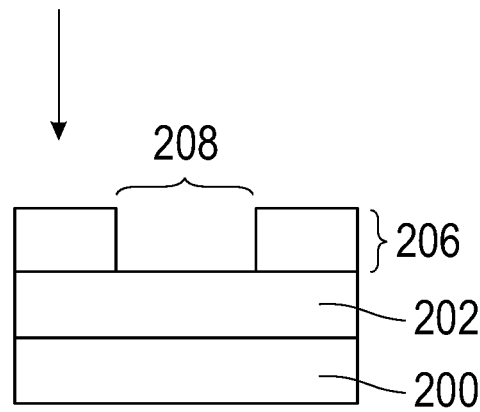
Figure 1C:
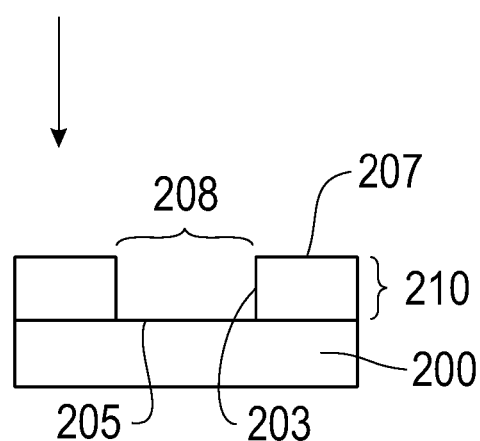
Figure 1D:
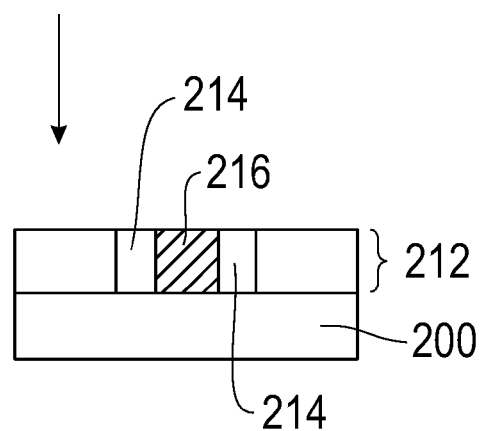

The methods described herein for directing self-assembly of a material (e.g., a block copolymer or a polymer blend) utilize a non-crosslinking photoresist and non-alkaline development to form a patterned photoresist layer. In an embodiment, the photoresist is also capable of chemical amplification. The patterned photoresist layer comprises non-crosslinked exposed photoresist that after development, in one embodiment, is insoluble in a given organic solvent used to cast a given material capable of self-assembly (i.e., SA material). In another embodiment, the patterned photoresist layer is treated photochemically, thermally, and/or chemically to render the treated photoresist insoluble in the organic solvent used to cast the SA material. In each embodiment, the photoresist retains solubility in an aqueous alkaline developer. The treatment does not distort or damage the photoresist pattern and does not irreversibly crosslink the photoresist. The patterned photoresist layer and the substrate surface uncovered by development provide a pre-pattern for self-assembly of the SA material by graphoepitaxy; or alternatively, if the trench height of the of the photoresist features is sufficiently small relative to the thickness of the SA material, by chemical epitaxy. In an embodiment, substrate surface properties conducive to self-assembly are retained in substrate surface regions that are not exposed to destructive radiation or to reactive byproducts of the chemical amplification of the exposed photoresist layer. Development removes the non-exposed photoresist disposed on these surface regions, which are then utilized for self-assembly. The photoresist can be easily removed before or after self-assembly using a standard aqueous alkaline developer or a suitably polar second organic solvent.

In the following description, a material capable of self-assembling into compositionally different, phase-separated domains is referred to as a SA material. The term "substrate" refers to all underlying layers of a structure on which the photoresist layer is disposed. The substrate can have one or more layers arranged in a stack. In a multi-layered substrate, the layer directly below and in contact with the photoresist layer is the top-most layer of the substrate, also referred to as "the underlayer" to the photoresist layer. The terms "surface" or "underlying surface" refer, unless otherwise stated, to the substrate surface on which the photoresist layer is disposed. As non-limiting examples, the photoresist layer can be disposed on the surface of a silicon wafer or a metal foil, or more particularly on the surface of an anti-reflection layer (ARC) of a multi-layer substrate, where the ARC layer is the top-most layer. In this example, the ARC layer is also the underlayer of the photoresist layer. In another example, the ARC layer has a polymer brush layer attached to the top surface. In this example, the polymer brush layer is also the underlayer of the photoresist layer.

A "pre-pattern" is a specific term used herein referring to the collection of surfaces contacted by the casting solution of the SA material. One or more of the surfaces directs self-assembly. The pre-pattern herein includes the surfaces and topography of the patterned photoresist layer, or treated patterned photoresist layer, and the substrate surface areas uncovered by development. The SA material can be disposed on all or some of these surfaces.

A "graphoepitaxial pre-pattern" is a pre-pattern in which topography and the surface properties influence self-assembly. A "chemical pre-pattern" is a pre-pattern in which surface properties provide major guidance on self-assembly. No sharp dimensional limits exist between these two pre-pattern categories because the extent of topographical influence on self-assembly is also dependent on the thickness of the SA layer in relation to the underlying relief surface. In some graphoepitaxy, the SA layer is thicker than the photoresist trench height, and the SA material is disposed on the photoresist mesa (top surface) as well as in the trench. In other graphoepitaxy, the thickness of the SA layer can be less than or equal to the trench height of the underlying pre-pattern. For chemical pre-patterns, the SA thickness is greater than any trench height of the underlying topography.

The term "disposed" refers to a layer in contact with a surface of another layer. "Disposing" or "applying" refer to forming a layer to be in contact with a surface of another layer, without limitation as to the method employed unless otherwise stated, with the proviso that the desirable characteristics of the disposed or applied layer are obtained, such as uniformity and thickness. The term "casting" refers to forming a layer of a material by disposing on another layer a solution of the material dissolved in a solvent, and removing the solvent. Unless otherwise stated, copolymers are random copolymers, indicated by "-co-", or "-r-" in the name. Block copolymers are indicated by "-b-" or "-block-" in the name. Alternating block copolymers are indicated by "-alt-" in the name.

A "polarity change" herein implies an altered chemical composition that affects relative solubility without crosslinking. "Inducing a polarity change" in the photoresist means subjecting the photoresist layer to a treatment that alters the chemical composition so as to render the treated photoresist less soluble in a non-alkaline developer compared to the pre-treated photoresist. As an example, the exposed photoresist has "increased polarity" compared to the non-exposed photoresist. An optional bake before development can further increase the polarity of the exposed photoresist through chemical amplification. Increased polarity can result from, for example, deprotection of protected polar functional groups in the exposed photoresist layer. An optional photochemical, thermal, and/or chemical treatment after development can further reduce the solubility of the developed photoresist layer in a casting solvent of the SA material. Polar functional groups can include carboxylic acid groups, hydroxyl groups, and combinations thereof. Protected forms of these functional groups include acid labile esters and ethers. The extent of the polarity change can be measured by comparing the solubility of the exposed and non-exposed photoresist in a non-alkaline developer. The exposed photoresist, having increased polarity, is less soluble in a given non-alkaline developer compared to the non-exposed photoresist. In an embodiment, the non-alkaline developer comprises the same solvent used to cast the SA material on the photoresist pre-pattern. The non-alkaline developer comprises an organic solvent. An organic non-alkaline developer does not contain a primary, secondary, or tertiary amine.

The term "chemical amplification" is well known in the art of photoresists, and refers to the catalytic reaction of functional groups of the photoresist as catalyzed by a photogenerated species. The fundamentals of chemical amplification and its application to photoresist chemistry is reviewed by Ito in "Chemical Amplification Resists for Microlithography" *Adv. Polym. Sci.*, vol. 172, pp. 37-245 (2005). The most common chemically-amplified photoresists utilize photoacid generators (PAGs) and the most commonly employed reaction mechanism is the acid-catalyzed deprotection of protected polar functional groups. For example, acid-sensitive esters can be catalytically converted to more polar carboxylic acid groups by a photo-released acid. Chemical amplification typically occurs during a post-exposure bake, when one photo-generated acid molecule catalyzes the deprotection of many ester groups in the exposed areas. The resulting deprotected photoresist has increased polarity compared to the as-exposed photoresist or the non-exposed photoresist.

The term 'non-crosslinking' refers to the mechanism by which the photoresist switches solubility with respect to the specified developing solution. In the methods described herein, the photoresist operates primarily by a polarity-switching mechanism rather than by a crosslinking mechanism for the previously stated reasons. It should be understood that some crosslinking or coupling reactions can advantageously occur in the exposed regions of the photoresist during the exposure or post-exposure bake processes; however, these reactions should not occur to a level sufficient to render the exposed photoresist material insoluble in both tetramethylammonium hydroxide photoresist developer and organic photoresist stripping solvents (e.g., propylene carbonate or gamma-butyrolactone). For example, some carboxylic acid anhydride linkages can be formed during baking at elevated temperatures in the presence of a strong photogenerated acid; however, these linkages can be cleaved by tetramethylammonium hydroxide and would not prevent the patterned photoresist from being stripped.

Herein, a "positive-tone photoresist" is a photoresist that becomes more soluble in an alkaline developer when exposed to radiation. The positive-tone photoresist does not crosslink when it is exposed, developed, or when optionally baked before or after development. A "negative-tone photoresist" becomes less soluble in an alkaline developer when exposed, typically due to a photo-induced crosslinking mechanism.

"Negative-tone development" means the non-exposed areas of the photoresist layer are removed during development. "Positive-tone development" means the exposed areas of the photoresist layer are removed during development.

It is understood that in some cases (e.g., when forming dense, high resolution patterns) all of the photoresist layer can receive some dose of radiation exposure. By "non-exposed photoresist" is meant the portion of the photoresist layer that has received insufficient dose to switch the solubility of the photoresist, either before or after an optional bake, in a given developer compared to the pre-exposed photoresist. An "exposed photoresist" has received sufficient exposure to switch the solubility of the photoresist, either before or after an optional bake, in a given developer compared to the pre-exposed photoresist.

Casting a solution of SA material on a photoresist layer is understood to mean the solution makes contact with the surfaces of the photoresist features and the substrate surface areas uncovered by development. When referring to the chemical components, reactivity, solubility and/or surface properties of the patterned photoresist, it is understood that such reference is directed only to the photoresist material and not to the substrate or the substrate surface, unless otherwise stated. Likewise, when referring to the chemical components, chemical reactivity, solubility and/or surface properties of the substrate surface or substrate layers, such reference is directed only to the substrate surface or substrate layer and not to the photoresist material, unless otherwise stated.

Figure 2A:
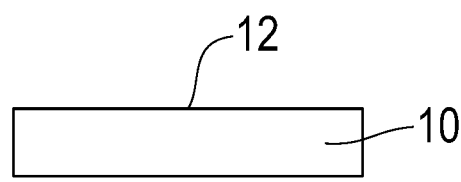
FIGS. 2A to 2H are schematic layer diagrams showing how a disclosed method of graphoepitaxy is implemented using a positive-tone photoresist and negative-tone development.
Figure 2B:
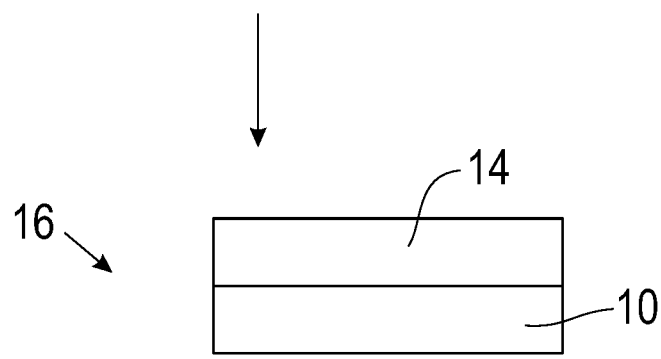
Figure 2C:
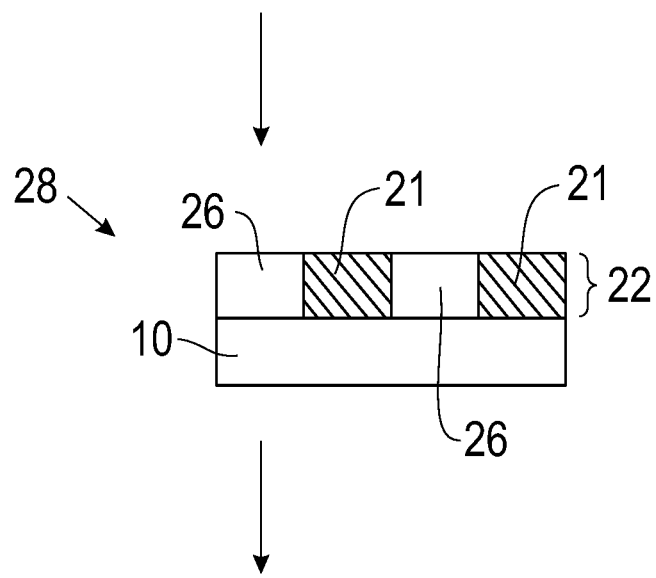
Figure 2D:
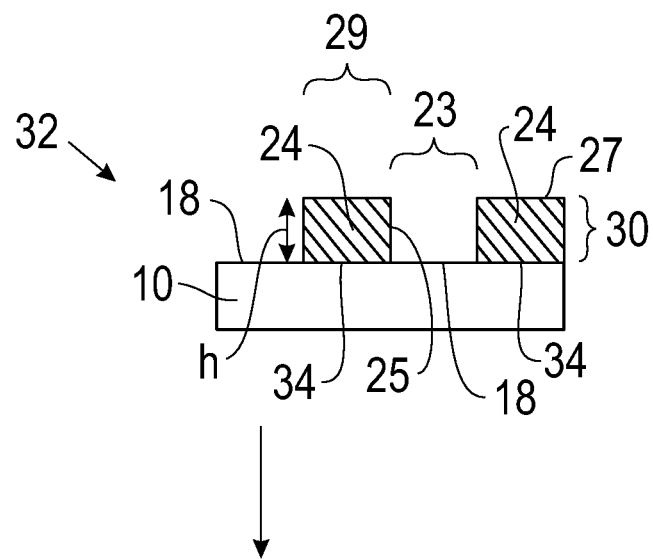
Figure 7:
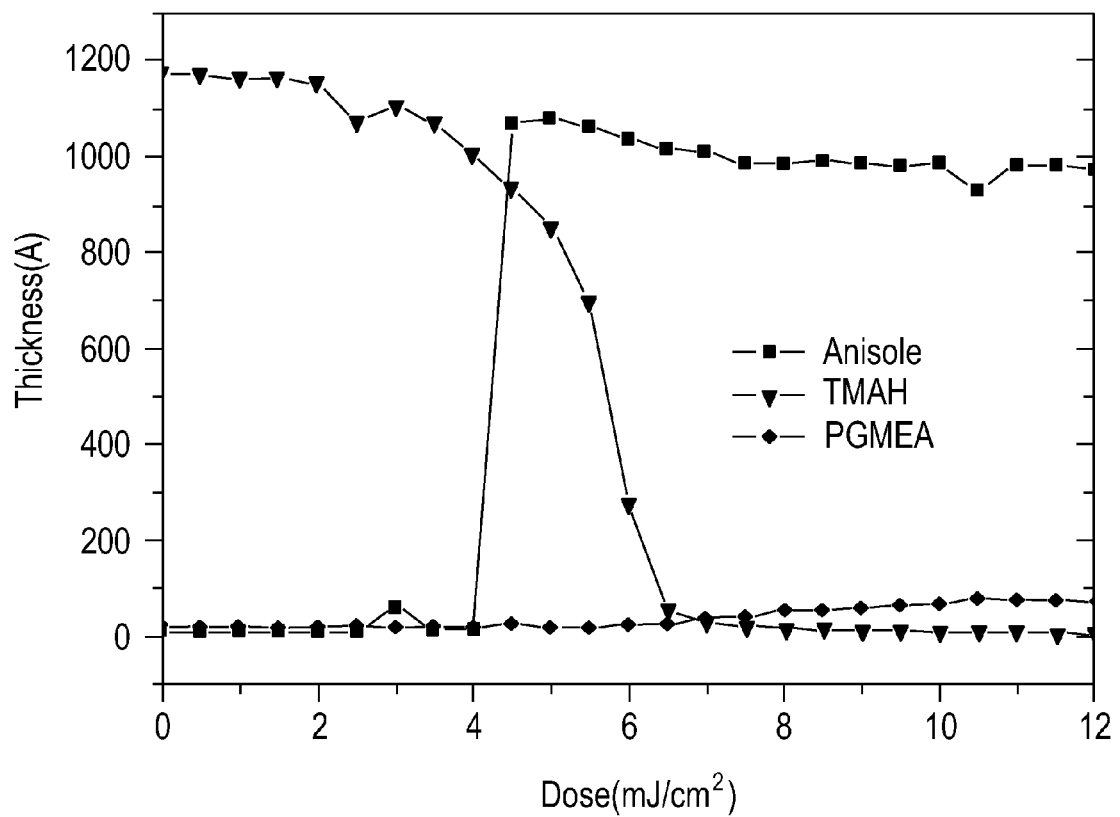
FIG. 7 is a graph depicting the effect of development solvent on the development contrast curve (i.e., thickness of the developed layer in angstroms plotted against exposure in $mJ/cm^2$) for a photoresist layer formed with JSR AR2928JN, a 193 nm positive-tone photoresist, that was developed in three different solvents: anisole, aqueous tetramethylammonium hydroxide (TMAH), and propylene glycol monomethyl ether acetate (PGMEA).

Formation of a layered structure using a SA material is illustrated in the schematic layer diagrams of FIGS. 2A to 2H. Substrate 10 of FIG. 2A has surface 12, on which is disposed a positive-tone photoresist layer 14 (FIG. 2B, structure 16). Pattern-wise exposure of photoresist layer 14 with first radiation (not shown) produces exposed photoresist layer 22 (FIG. 2C, structure 28). Exposed photoresist layer 22 is composed of regions of exposed photoresist 21 and non-exposed photoresist 26. A chemical transformation is induced in the exposed photoresist 21 as a result of the exposure or in combination with a post-exposure bake. Subsequent development of exposed photoresist layer 22 using a given non-alkaline developer removes non-exposed photoresist 26 to produce patterned photoresist layer 30 (FIG. 2D, structure 32). Patterned photoresist layer 30 comprises photoresist features 29 comprising developed photoresist 24 (also referred to as pre-treated photoresist) disposed on a first surface 34 of substrate 10. Photoresist feature 29 has top surface 27 and sidewall 25. The developed photoresist 24 has increased polarity compared to the non-exposed photoresist 26 due, for example, to acidolysis of protected polar acidic groups such as tertiary esters formed by the exposure and any optional post exposure bake. The increased polarity renders the exposed photoresist 21 insoluble in a given non-alkaline developer. The non-exposed photoresist 26 is soluble in the non-alkaline developer. In particular, the non-alkaline developer comprises a low polarity organic solvent (e.g., anisole) which will selectively dissolve the non-exposed (or low dose exposed) photoresist in the presence of the more highly exposed photoresist. Consequently, development with a non-alkaline developer affords a negative-tone image (i.e., the non-exposed photoresist material is selectively removed). FIG. 7, explained in more detail further below, illustrates positive-tone development using a conventional aqueous alkaline developer, TMAH, and negative-tone development using anisole.

The topography of patterned photoresist layer 30 can potentially guide self-assembly of SA materials by spatially allocating SA materials in the trench area and/or on the mesa (top surface 27 in FIG. 2D), depending on the surface affinity of the developed photoresist 24 and the substrate for the SA material. For graphoepitaxy, the thickness (i.e., height h in FIG. 2D) of the developed photoresist 24 is usually greater than or comparable to (shown) the thickness of the SA materials. More specifically, the surface properties of trench sidewalls 25 and substrate surface 18 should be suitable for guiding self-assembly of the SA material. In a particular embodiment, one domain of the self-assembled material has an affinity for sidewalls 25.

Figure 2E:
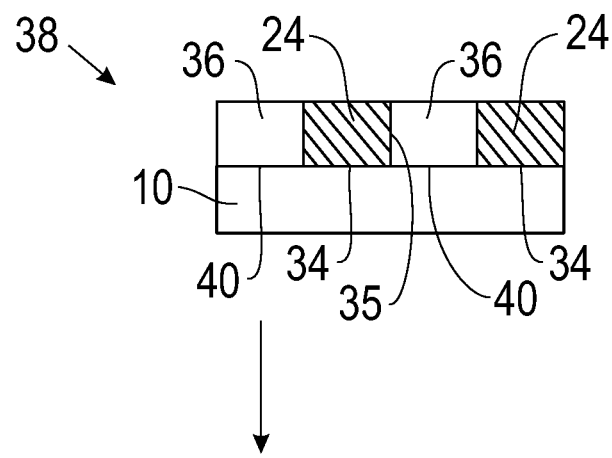
Figure 2F:
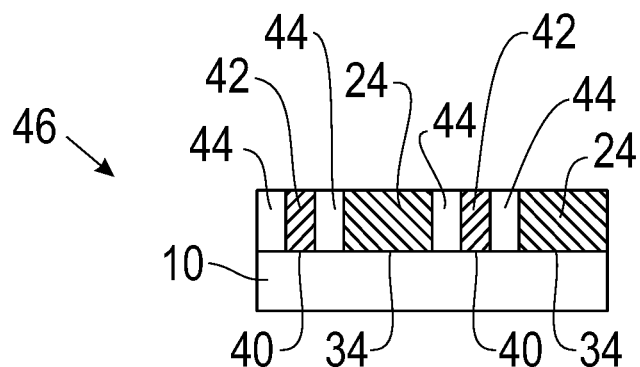

A solution of the SA material in a suitable casting solvent is casted on the patterned photoresist layer 30 without dissolving the non-crosslinked, developed photoresist 24. Removing the casting solvent results in the SA material 36 substantially located in trench 23 of patterned photoresist layer 30, disposed on substrate surface 40 (FIG. 2E, structure 38). The SA material can self-assemble spontaneously or with optional baking, and/or annealing to form a domain pattern of the self-assembled material disposed on substrate surface 40. Substrate surface 40 can have properties the same as, or substantially the same as, substrate surface 12 and/or substrate surface 18. That is, the properties of substrate surface 12 are retained by substrate surface 18 and substrate surface 40 after exposure and development of photoresist layer 14, and casting the SA material. The domain pattern can comprise, for example, domains 42 and 44 of self-assembled material as shown in structure 46 (FIG. 2F). Other domain patterns are possible. For example, domains 42 and 44 can be perpendicularly oriented lamellar domains relative to the substrate. The lamellar domains can form parallel to the trench sidewall (consistent with FIG. 2F) or perpendicular to the trench sidewall (not shown) depending upon the relative affinities of the sidewalls 25 and surface 12 for domains 42 and 44. Furthermore, depending on the geometry and surface properties of the trench area, the trench area 23 can comprise a single domain of the self-assembled material, or more than two different domains.

Figure 2G:
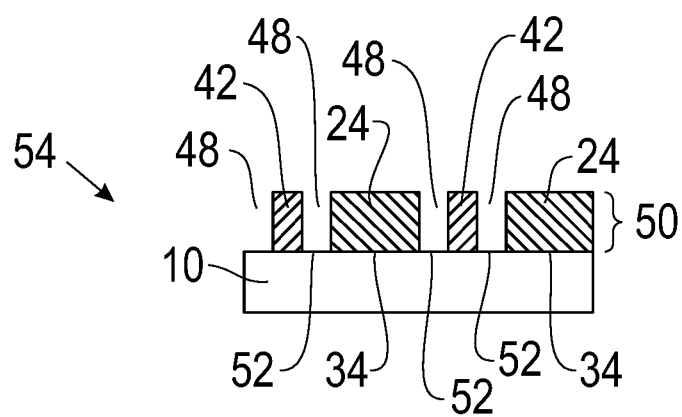
Figure 2H:
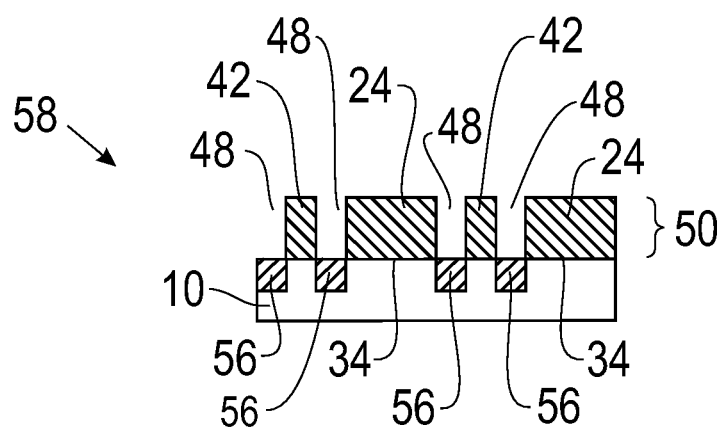

Domains 42 and 44 comprise different components of the SA material (i.e., they are compositionally different). Domains 42 can, for example, comprise one block of a block copolymer, and domains 44 can comprise a different block of a block copolymer. Further, one of the domains, for example domains 44, can be selectively removed (e.g., by plasma etching or wet etching) in the presence of domains 42 to produce layered structure 54 (FIG. 2G). Selective removal of domains 44 produces relief pattern 50 having openings 48, revealing uncovered surface 52 of substrate 10. Uncovered surface 52 can have the same or different surface properties compared to uncovered surface 12. Relief pattern 50 can be simultaneously or subsequently transferred to substrate 10, indicated by altered regions 56 in structure 58 of FIG. 2H. Region 56 can be an opening, pit, or a chemically altered state of substrate 10. Alternatively, openings 48 can be filled with another material (e.g., a conductive metal) (not shown). The above described method advantageously forms a domain pattern of a self-assembled material on a surface of the substrate without removing the patterned photoresist layer.

The polarity change of the exposed photoresist 21 can vary depending on the photoresist material, the exposure conditions, the post-exposure bake, and other factors. With sufficient polarity change, the exposed and baked photoresist can become insoluble in one developer solvent (e.g., anisole) while remaining soluble in another more polar organic solvent (e.g., PGMEA). With additional post-development treatment, the treated photoresist can become insoluble in PGMEA. Both the developed photoresist and the treated photoresist can be easily removed before or after self-assembly of the SA material using a standard aqueous alkaline developer and/or a suitable second organic solvent, such as a photoresist stripping solvent (e.g., propylene carbonate or gamma-butyrolactone). The second organic solvent can also remove the SA material to enable the rework of wafers after the self-assembly process. Reworking a wafer can occur, for example, when post-development inspection detects unacceptable defects (e.g., misalignment) in the photoresist pattern. The wafer can be solvent stripped to remove the photoresist before the wafer is etched or otherwise irreversibly altered. The wafer can then be resubmitted to the photoresist pattern generating process.

Figure 3:
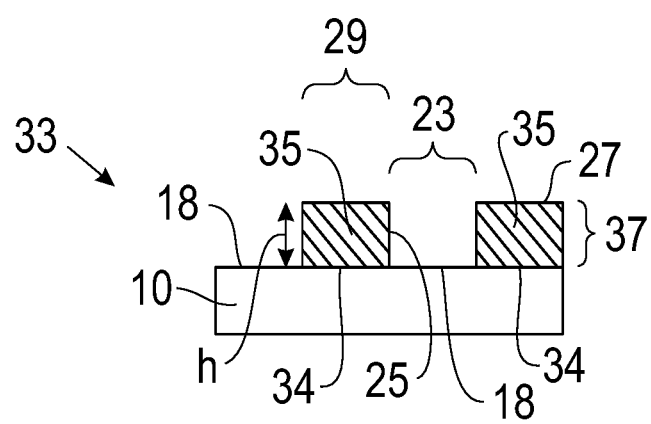
FIG. 3 is a schematic layer diagram showing a treated patterned photoresist layer.

As stated above, a post-development treatment of the patterned photoresist layer 30 can be utilized prior to application of the SA material. This can be advantageous, for example, to overcome defects associated with excessive exposures and baking prior to development, or when employing more polar organic casting solvents for the SA material, such as monoalcohols, glycols, glycol mono ethers, and glycol monoether esters (e.g., PGMEA). A treated patterned photoresist layer 37 is shown in the schematic diagram of FIG. 3, structure 33. Treated patterned photoresist layer 37 can be produced, for example by submitting patterned photoresist layer 30 of structure 32 (FIG. 2D) to an appropriate post-development treatment. Treated patterned photoresist layer 37 comprises treated photoresist 35, and has decreased solubility in a casting solvent of the SA material compared to developed photoresist 34 (FIG. 2D). Like developed photoresist 24, treated photoresist 35 is non-crosslinked and is soluble in aqueous alkaline developer (i.e., TMAH) or highly polar second organic solvents (e.g., propylene carbonate or gamma-butyrolactone). The treatment does not cause substantial reflow of the non-crosslinked photoresist, which can damage or distort photoresist features 29.

The post-development treatment can be photochemical, thermal, chemical, or a combination thereof. The decreased solubility of the treated patterned photoresist layer 37 in a casting solvent of the SA material can vary depending on the photoresist material and the treatment conditions. As an example, the patterned photoresist layer 30 can be given a second exposure to second radiation to form treated patterned photoresist layer 37. The second exposure can be performed with a single wavelength of second radiation or a combination of suitable wavelengths (broad band) of second radiation, so long as the exposure is effective in inducing the desired solubility behavior of the treated patterned photoresist layer 37 in the SA casting solvent. In an embodiment, the second radiation comprises the first radiation used to form patterned photoresist layer 30. The treatment can be a flood exposure. The flood exposure can be a single conventional whole area exposure or a combination of conventional whole area exposures. The flood exposure can be from 1 to 200 mJ/cm$^2$, more particularly from 2 to 150 mJ/cm$^2$, and even more particularly from 3 to 100 mJ/cm$^2$. The treatment can also be a scanning exposure delivered by digital writing device employing light emitting sources such as a laser, light-emitting diode (LED), or cathode ray tube (CRT). The second exposure can be followed by a thermal treatment to chemically amplify the formation of polar groups in the treated patterned photoresist layer. For example, the flood exposure can release additional acid from previously unreacted photoacid generator (PAG) that upon subsequent heating catalyzes the deprotection of additional acid-sensitive carboxylic acid esters, aromatic acetals/ketals, and/or carbonates, thereby increasing the concentration of carboxylic acid and phenol groups in the treated patterned photoresist layer. With sufficient polarity change, the treated patterned photoresist layer can be rendered insoluble in either a low polarity solvent (e.g., anisole) or a more polar organic solvent used to dissolve and cast the SA material (e.g., PGMEA), while retaining solubility in aqueous alkaline developer and/or a second organic solvent, without crosslinking the photoresist.

More particularly, the patterned photoresist layer is given a thermal treatment. The thermal treatment can comprise heating the patterned photoresist layer or the second exposed patterned photoresist layer at a temperature of 60° C. to 300° C., 80° C. to 250° C., 80° C. to 200° C., 100° C. to 200° C., 150° C. to 200° C., 165° C. to 200° C., or 165° C. to 170° C. Heating at each of the foregoing temperature ranges can be performed for at least 1 sec, 1 sec to 1 day, 1 sec to 12 hours, 1 sec to 1 hour, 10 sec to 30 minutes, 10 sec to 15 minutes, 1 minute to 15 minutes, 1 minute to 10 minutes, 2 minutes to 10 minutes, 3 minutes to 10 minutes, or 4 minutes to 6 minutes. More particularly, the patterned photoresist layer or the second exposed patterned photoresist layer can be heated at 60° C. to 300° C. for 1 sec to 1 hour, 80° C. to 250° C. for 10 sec to 10 minutes, 150° C. to 200° C. for 2 minutes to 10 minutes, or 165° C. to 175° C. for 3 minutes to 10 minutes. Even more particularly, the patterned photoresist layer or the second exposed patterned photoresist layer can be heated at 165° C. to 175° C. for 4 minutes to 6 minutes. In an embodiment, the thermal treatment is performed without a photochemical or chemical treatment. In another embodiment, the treatment comprises heating the patterned photoresist layer at 60° C. to 300° C. for 1 sec to 1 day to form a treated patterned photoresist layer ("treated layer") comprising non-crosslinked, treated photoresist.

A chemical treatment can include, for example, contacting the patterned photoresist layer 30 with the vapors of a volatile Lewis acid, such as hydrochloric acid, sulfuric acid, nitric acid, or a sulfonic acid. In each type of treatment, the chemical alteration of the photoresist is preferentially uniformly distributed throughout the treated photoresist, not just at the surface.

A solution of the SA material can then be cast on the treated patterned photoresist layer 37 without dissolving the treated photoresist 35, followed by self-assembly of the SA material as described above. Advantageously, the treated non-crosslinked photoresist 35 can be easily removed using aqueous alkaline developer or a highly polar second organic solvent before or after casting the SA material.

Figure 4A:
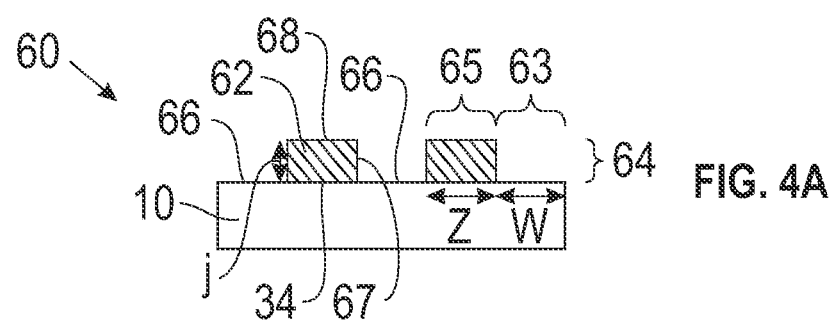
FIGS. 4A to 4D are schematic layer diagrams showing how a disclosed method of chemical epitaxy is implemented using a positive-tone photoresist and negative-tone development when w+z (see FIG. 4C) is about the pitch of self-assembled materials.
Figure 4B:
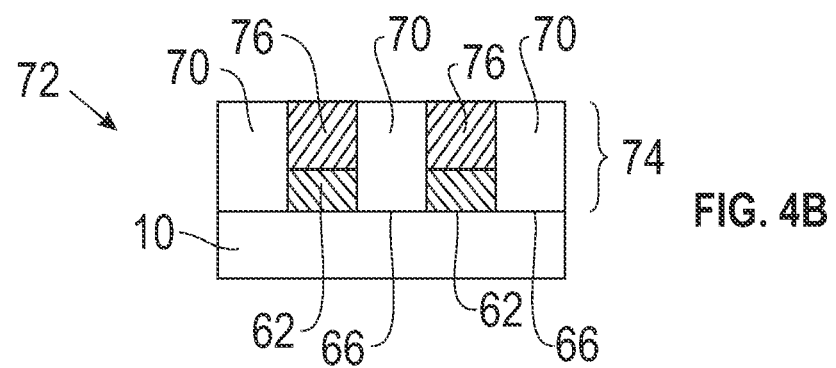

Chemical epitaxy is further illustrated in the process of FIGS. 4A to 4D. In FIG. 4A, structure 60 is composed of a patterned photoresist layer 64 comprising photoresist features 65 and uncovered substrate surfaces 66. Photoresist features 65 comprise non-crosslinked exposed photoresist 62 disposed on a substrate surface 34 of substrate 10. The trench area 63 has width w and photoresist feature 65 has width z. The pitch of patterned photoresist (w+z) is about the pitch of self-assembled materials. As previously described, patterned photoresist layer 64 can be further treated photochemically, thermally and/or chemically to reduce the solubility of the exposed photoresist material 62 in a casting solvent of the SA material. In this example patterned photoresist layer 64 and substrate surface 66 provide a chemical pre-pattern for self-assembly of the SA material. Height j of trench 63 is small enough relative to the thickness of the SA material that sidewall 67 has negligible influence on self-assembly; that is, self-assembly is controlled primarily by photoresist top surface 68 and substrate surface 66. In this case, photoresist top surface 68 and substrate surface 66 have different surface wetting properties for the SA material. Self-assembly can be directed by photoresist top surface 68 (shown), or by substrate surface 66, or both when each surface has a preferential affinity for a different domain of the SA material. In this example, photoresist top surface 68 has a preferential affinity for domain 76 of the self-assembled material (FIG. 4B). The surface properties of photoresist top surface 68 can be modified to tune the chemical affinity prior to application of the SA materials. The height j (i.e., thickness) of the non-crosslinked, exposed photoresist 62 should be less than the thickness of the SA materials in order to direct self-assembly primarily by chemical interactions. The properties of substrate surface 66 can be the same, or substantially the same as, the properties of substrate surface 12.

As before, a solution of the SA material is cast onto patterned photoresist layer 64 without dissolving the photoresist features 65. In particular, the solvent for the SA material is an organic solvent. Removing of the organic solvent and optionally baking and/or annealing of the layer results in a domain pattern 74 comprising domains 70 and 76 of the self-assembled material (FIG. 4B, structure 72). As shown, the self-assembled material forms domain pattern 74 disposed on photoresist top surface 68 and substrate surface 66 (FIG. 4A). In the example shown, photoresist top surface 68 has a preferential affinity for domains 76; therefore, some domains 76 preferentially self-assemble on photoresist top surface 68. In this example, substrate surface 66 can have a preferential affinity for domain 70, but not for domain 76. Alternatively, substrate 66 can have no preferential affinity for either domains 70 or 76, but can support the perpendicular orientation of both domains 76 or 70. In such a fashion, the patterned photoresist layer 64 guides the location of the self-assembled domains.

As indicated by this example, the surface properties of both the exposed photoresist 62 and the uncovered substrate surface can still be conducive to DSA after pattern-wise exposure, development and any optional baking of the photoresist layer. The effect of these treatments on the surface properties of the substrate should be considered independently of their effects on the exposed photoresist 62.

Figure 4C:
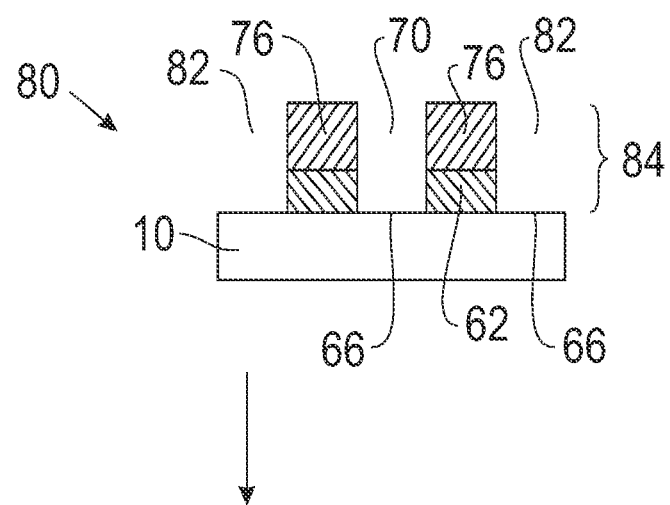
Figure 4D:
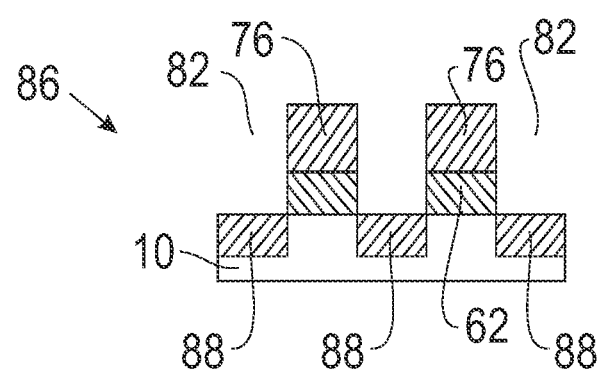

One of the domains 70 or 76 can be selectively removed in the presence of the other domain to produce a relief pattern 84 (FIG. 4C). Relief pattern 84 comprises openings 82 (FIG. 4C, structure 80) that can be transferred into the substrate to form altered substrate regions 88 (FIG. 4D, structure 86). In this example the width (w) of trench area 63 plus the width (z) of the photoresist feature 65 is about the pitch of self-assembled materials, resulting in no change in the spatial frequency of the SA domain pattern relative to the patterned photoresist layer 64.

As shown in FIG. 4C, relief pattern 84 also has the same spatial frequency as the underlying patterned photoresist layer 64. In general, the width z of the photoresist feature 65 can be larger or smaller than the width of the domain 76 for which it has preferential affinity. The pitch of the chemical pre-pattern (w+z) should be roughly commensurate with an integral multiple of the pitch of the self-assembled domains of block copolymers. For guiding a polymer blend with no intrinsic periodicity, the pitch of the chemical pre-pattern (w+z) should be roughly in the same order of magnitude of the dimensions of the self-assembled domains of polymer blends comprising at least two immiscible polymers.

Figure 5A:
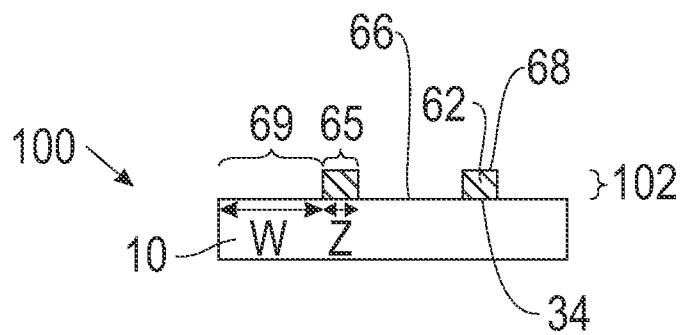
FIGS. 5A to 5C are schematic layer diagrams showing how a disclosed method of chemical epitaxy is implemented using a positive-tone photoresist and negative-tone development when w+z (see FIG. 5A) is about twice the pitch of self-assembled materials.
Figure 5B:
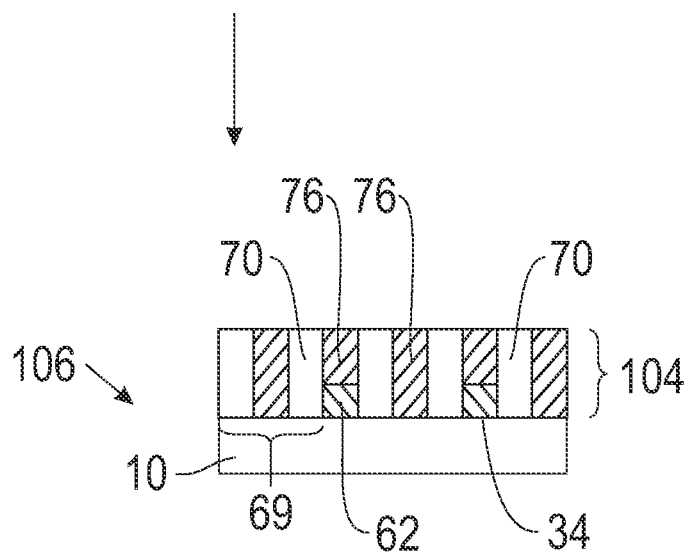
Figure 5C:
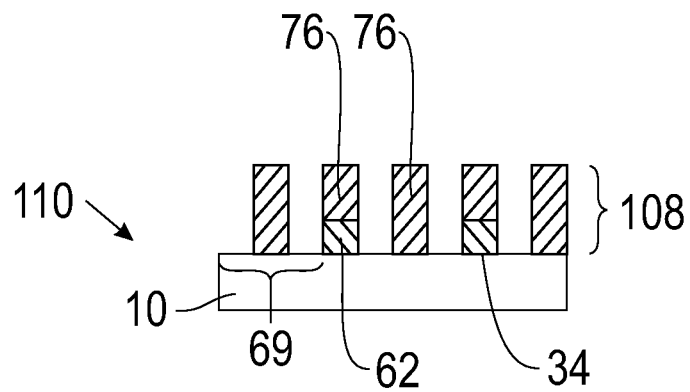

Frequency multiplication can be achieved relative to the patterned photoresist layer, when w+z is greater than or equal to twice the pitch of self-assembled domains. This can occur when width (z) of the photoresist feature is relatively small compared to the width of uncovered substrate surfaces (w), as illustrated in the schematic layer diagrams of FIGS. 5A to 5C. In structure 100 of FIG. 5A, trench area 69 has width (w), photoresist feature 65 has width (z), and w is approximately equal to 3z. Casting the SA material on the patterned photoresist layer 102 results in a self-assembled SA layer 104 comprising alternating domains 70 and 76 (FIG. 5B, structure 106). The pitch (w+z) of patterned photoresist layer 102 (FIG. 5A) is twice the pitch of self-assembled domains 76 and 70 in structure 106 (FIG. 5B). Selective removal of one domain 70 results in relief pattern 108 of structure 110 (FIG. 5C) also having twice the spatial frequency of the patterned photoresist layer 102. As shown, the photoresist surface 68 has a preferential affinity for domain 76, and uncovered substrate surface 66 supports the perpendicular orientation of domains 70 and 76.

Figure 6:
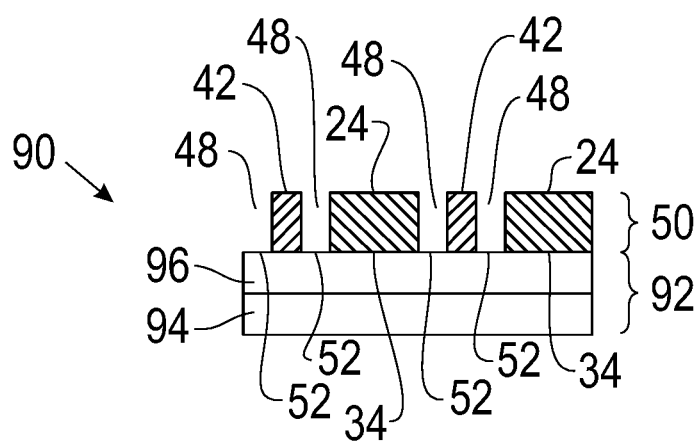
FIG. 6 is a schematic layer diagram corresponding to FIG. 2G, having a two-layer substrate rather than a one-layer substrate.

To further illustrate a multi-layered substrate, layered structure 54 of FIG. 2G is reproduced in layered structure 90 of FIG. 6, with the exception that substrate 92 of FIG. 6 has two layers, a bottom layer 94 and an intermediate layer 96. Bottom layer 94 of substrate 92 can be, for example, a silicon wafer. Intermediate layer 96 can be, for example, an ARC layer, where uncovered surface 52 is a surface of the ARC layer. Likewise, a multi-layered substrate in layered structure 80 of FIG. 4C can be similarly utilized (not shown).

Advantageously, preferred methods utilize the combination of a high resolution, non-crosslinking, positive-tone photoresist that operates by a polarity-switching mechanism, and negative-tone development, to form a patterned photoresist layer comprising non-crosslinked, exposed photoresist. It is the exposed photoresist that has increased polarity compared to the non-exposed photoresist. The increased polarity permits selective removal of the non-exposed photoresist using a non-alkaline developer to form the patterned photoresist layer. Few, if any, commercial high resolution negative-tone photoresists operate by this mechanism. Most negative-tone photoresists are designed to be developed in alkali developer to remove non-exposed photoresist, and rely on crosslinking of the exposed photoresist rather than a polarity change to induce insolubility in the alkali developer. In the present methods, the polarity change (e.g., by acidolysis of ester groups to form carboxylic acid groups) in the exposed regions of a positive-tone photoresist induces insolubility of the exposed photoresist in the non-alkaline developer. Thus, a conventional high resolution positive-tone photoresist that is typically used to produce a positive-tone image when developed with an alkaline developer is used herein to produce a negative-tone image through the use of a non-alkaline developer.

The combination of highly optimized conventional positive-tone photoresists and negative-tone development is effective in producing topographical or chemical pre-patterns suitable for self-assembly. Negative-tone development using a non-alkaline developer beneficially minimizes damage to the underlayer or modification of the surface properties of the underlayer that are critical to high quality DSA. Damage to the underlayer can be caused, for example, by the chemical changes in the exposed regions of the photoresist layer. In the present methods, the surface properties conducive to DSA are preferably retained by the surface throughout the process of disposing, exposing, and developing the photoresist layer, each of which can optionally include a post-bake.

The selectivity of an exemplary commercial 193 nm positive-tone photoresist (JSR AR2928JN) to various developer solvents is graphically shown in FIG. 7. The positive-tone photoresist was disposed on a substrate to form a photoresist layer having a thickness of approximately 1200 angstroms. The photoresist layer was given a post-apply bake (i.e., heated after casting the photoresist layer) at 120° C. for 60 sec. The photoresist layer was then exposed to 193 nm deep ultraviolet (DUV) radiation, followed by a post-exposure bake at 115° C.

for 60 sec. The exposed photoresist layer was developed by either standard aqueous base developer, 0.26N tetramethylammonium hydroxide (TMAH), or by a non-alkaline developer (e.g., anisole or PGMEA) for 30 sec. The contrast curves show that the alkaline TMAH developer selectively dissolved the exposed photoresist (i.e., layer thickness goes to zero at higher exposure doses) in typical positive-tone development behavior. In contrast, the non-alkaline developer anisole selectively dissolved the non-exposed photoresist (i.e., negative-tone development). PGMEA was non-selective and dissolved the exposed and non-exposed photoresist under these conditions.

The substrate, and more particularly the surface of the substrate, can comprise inorganic or organic materials such as metals, carbon, or polymers. More particularly, the substrate can comprise any semiconducting material including, for example, Si, SiGe, SiGeC, SiC, Ge alloys, GaAs, InAs, InP, as well as other III-V or II-VI compound semiconductors. The substrate can also comprise a layered semiconductor such as Si/SiGe, or a semiconductor-on-insulator (SOI). In particular, the substrate can contain a Si-containing semiconductor material (i.e., a semiconductor material that includes Si). The semiconductor material can be doped, undoped or contain both doped and undoped regions therein. Surfaces comprising one of silicon native oxides, silicon oxides, or silicon nitrides are preferentially wetted by, for example, PMMA block components, but not by PS block components of a PS-b-PMMA block copolymer. Therefore, surfaces comprising these materials can serve as pinning materials for the directed self-assembly of a PS-b-PMMA block copolymer.

The substrate can comprise a surface affinity control material that imparts controlled affinity of the surface towards the various domains of the SA material. In one example, the surface affinity control material has no preferential affinity (e.g., substantially similar affinities) for all of the domains of the SA material. Non-limiting examples of surface affinity control materials include materials used in ARC layers, which can include random copolymers selected from the group of homopolymers or copolymers selected from the group consisting of polybisphenols, polysulfones, polycarbonates, polyhydroquinones, polyphthalates, polybenzoates, polyphenylethers, polyhydroquinone alkylates, polycarbamates, polymalonates and mixtures thereof. These moieties are typically functionalized in order to tune the required physical properties of the polymer (optical constants, surface energy). The polymer components also typically contain a plurality of reactive sites distributed along the polymer for reaction with a crosslinking component. More specific materials used in ARC layers include polymers disclosed in US Patent Application 20090186294, including poly(4,4'-methylenebisphenol-co-epichlorohydrin), poly(4,4'-ethylidenebisphenol-co-epichlorohydrin), poly(4,4'-isopropylidenebisphenol-co-epichlorohydrin), poly(4,4'-isopropylidenebis[2-methylphenol]-co-epichlorohydrin), poly(4,4'-isopropylidenebis[2,6-dimethylphenol]-co-epichlorohydrin), poly(4,4'-cyclohexylidenebisphenol-co-epichlorohydrin), poly(4,4'-[1-phenylethylidene]bisphenol-co-epichlorohydrin), poly(4,4'-trifluoroisopropylidenebisphenol-co-epichlorohydrin), poly(4,4'-hexafluoroisopropylidenebisphenol-co-epichlorohydrin), poly(4,4'-sulfonylbisphenol-co-epichlorohydrin), poly(bisphenol AF adipic ester), poly(bisphenol AF succinic ester), poly(4,4'-hexafluoroisopropylidenediphthalate-co-epichlorohydrin), poly(4,4'-hexafluoroisopropylidenediphthalate-co-poly(bisphenol AF)), poly(4,4'-hexafluoroisopropylidenebisbenzoate-co-epichlorohydrin), poly(3,3',4,4'-benzophenonetetracarboxylate-co-epichlorohydrin), poly(4,4'-hexafluoroisopropylidenediphthalate-co-epichlorohydrin-co-2,6-bis[hydroxymethyl]-p-cresol), poly(3,3',4,4'-benzophenonetetracarboxylate-co-epichlorohydrin-co-2,6-bis[hydroxymethyl]-p-cresol), poly(terephthalate-co-epichlorohydrin), poly(2-nitroterephthalate-co-epichlorohydrin), poly(2-nitrophthalate-co-epichlorohydrin), poly(2-nitroisophthalate-co-epichlorohydrin), poly(hydroquinone-co-epichlorohydrin), poly(methylhydroquinone-co-epichlorohydrin), poly(1,2,4-benzenetriol-co-epichlorohydrin), poly(methylene-bis[4-aminophenyl]-co-glycerol carbamate), poly(isopropylidene-bis[4-aminophenyl]-co-glycerol carbamate), poly(isopropylidene-bis[3-carboxy-4-aminophenyl]-co-glycerol carbamate), poly(methylene-bis[4-hydroxyphenyl]-co-glycerol carbonate), poly(isopropylidene-bis[4-hydroxyphenyl]-co-glycerol carbonate), poly(isopropylidene-bis[3-carboxy-4-hydroxyphenyl]-co-glycerol carbonate), poly(2-phenyl-1,3-propanediol malonate), poly(2-phenyl-1,3-propanediol 2-methyl-malonate), poly(1,3-propanediol benzylidene-malonate), poly(2-phenyl-1,3-propanediol benzylidene-malonate), and glycidyl end-capped poly(bisphenol A-co-epichlorohydrin). A more specific ARC layer comprises silicon, such as Shin Etsu A940. Another more specific surface affinity control material described in U.S. Pat. No. 7,521,090 comprises a thermal acid generator or photoacid generator and poly(styrene-co-epoxydicyclopentadiene methacrylate), P(S-r-EDCPMA):

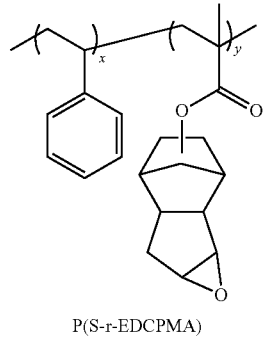

P(S-r-EDCPMA)

wherein x and y are each integers equal to or greater than 1. Other surface affinity control materials include poly(styrene-co-methyl methacrylate-co-epoxydicyclopentadiene methacrylate), poly(styrene-co-methyl methacrylate-co-glycidyl methacrylate), poly(styrene-co-methyl methacrylate-co-2-hydroxyethyl methacrylate), poly(styrene-co-methyl methacrylate-co-4-vinyl cinnamate), poly(styrene-co-methyl methacrylate-co-vinyl benzocyclobutane), poly(styrene-co vinyl benzocyclobutane, poly(alpha-methyl styrene-co-methyl methacrylate), and poly(methyl glutarimide) (PMGI). Other surface affinity control materials comprise polymer brush layers including those formed by hydroxyl-terminated poly(styrene-co-methyl methacrylate), poly(styrene-co-methyl methacrylate-co-2-hydroxyethyl methacrylate), hydroxyl-terminated poly(styrene), hydroxyl-terminated poly(methyl methacrylate), and poly(styrene-b-methyl methacrylate) block copolymer, and combinations of the foregoing surface affinity materials. Other surface affinity materials include self-assembled monolayers.

The photoresist layer is prepared by disposing a photoresist composition on a substrate. The photoresist composition comprises a photoresist and optionally selected additives that do not adversely affect the desirable properties of the photoresist layer, such as developability and compatibility with the SA casting solvent. Exemplary optional additives include photo-acid generator, thermal acid generator, acid amplifier, photobase generator, thermal base generator, photo-destructible base, surfactant, an organic solvent, base quencher, sensitizer, and combinations of the foregoing additives.

The photoresist can comprise a polymer having repeating units derived from one or more monomer units, in particular a tertiary ester moiety. The polymer can be a copolymer, a terpolymer, or a tetrapolymer. Examples of tertiary ester moieties include those that can be deprotected by an acid generated from a photoacid generator (PAG) such as those disclosed in U.S. Pat. No. 4,491,628, "Positive- and Negative-working Resist Compositions with Acid Generating Photoinitiator and Polymer with Acid Labile Groups Pendant From Polymer Backbone" to H. Ito, et al. Non-limiting examples of tertiary ester moieties include ester derivatives of structural groups such as: methyladamantane, ethyladamantane, methylcyclopentane, ethylcyclopentane, methylcyohexane, ethylcycohexane, methylcycloheptane, ethylcycloheptane, methylcyclooctane, and ethylcyclooctane. Other tertiary esters include trityl esters, isobornyl esters, dicyclopropylmethyl esters, dimethylcyclopropylmethyl esters and t-butyl esters. Repeating units can comprise a wide range of other acid labile groups, including for example, tertiary carbonates of phenols, benzyl esters, benzyhydryl esters, acetals, ketals, trialkylsilyl esters such as trimethylsilyl ester, tetrahydrofuranyl esters, tetrahydropyranoyl esters, 3-oxocyclohexanonyl, and mevalonic lactonyl esters, and the like. The polymer can also have repeating units containing a lactone moiety in combination with repeating units containing at least one acid labile moiety, where such a configuration can impart good lithographic performance to the photoresist. When desirable, lactone moieties can improve dissolution in aqueous developer. Examples of repeating units containing lactones moieties include 5-methacryloyloxy-2,6-norbornanecarbo-gamma-lactone, 3-methacryloyloxymethyl-2,6-norbornanecarbolactone, 3-acryloyloxymethyl-2,6-norbornanecarbo lactone, alpha-acryloyloxy-gamma-butyrolactone, alpha-methacryloyloxy-gamma-butyrolactone, beta-acryloyloxy-gamma-butyrolactone and beta-methacryloyloxy-gamma-butyrolactone.

Other examples of suitable chemically-amplified resists for use at 248 nm, 193 nm, 157 nm, EUV, and e-beam lithography can be found in Ito in "Chemical Amplification Resists for Microlithography" Adv. Polym. Sci., vol. 172, pp. 37-245 (2005).

The photoresist can also comprise a blend of two or more polymers. In an embodiment, the photoresist is a non-crosslinking photoresist capable of chemical amplification.

More specific positive-tone photoresists include JSR AM2073J (a commercial non-crosslinking, positive-tone, 193 nm photoresist capable of chemical amplification), JSR AR2928JN (a commercial non-crosslinking, positive-tone 193 nm photoresist capable of chemical amplification), and poly(t-butyloxycarbonyloxystyrene-co-methyl methacrylate) P(BOCST-r-MMA), a 248 nm/e-beam photoresist capable of chemical amplification.

A photosensitive acid generator (PAG) is capable of releasing or generating acid upon exposure to radiation. Exemplary PAGs include, for example, (trifluoro-methylsulfonyloxy)-bicyclo[2.2.1]hept-5-ene-2,3-dicarboximide (MDT), N-hydroxy-naphthalimide (DDSN), onium salts, aromatic diazonium salts, sulfonium salts, diaryliodonium salts, sulfonic acid esters of N-hydroxyamides, imides, and combinations thereof.

A thermal acid generator (TAG) is capable of releasing or generating acid upon heating. Exemplary thermal acid generators include diaryl iodonium salts, sulfonate esters of oximes, sulfonate esters of benzyl alcohols, sulfonate esters of imides, N-allyl-N-dimethylanilinium hexafluoroantimonate salts, and N-crotyl-N-dimethylanilinium hexafluoroantimonate salts, and sulfonic ester compounds such as cyclohexyl p-toluenesulfonate, cyclohexyl propanesulfonate, cyclohexyl methanesulfonate, cyclohexyl octanesulfonate, cyclohexyl camphorsulfonate, and combinations thereof.

An acid amplifier is a compound that is decomposed with an acid to generate an acid. For these compounds, reference should be made to J. Photopolym. Sci. and Tech., 8, 43-44, 45-46 (1995), and J. Photopolym. Sci. and Tech., 9, 29-30 (1996). Non-limiting examples of acid amplifiers include tert-butyl-2-methyl-2-tosyloxymethyl acetoacetate and 2-phenyl-2-(2-tosyloxyethyl)-1,3-dioxolane. Of well-known photoacid generators, many of those compounds having poor stability, especially poor thermal stability, and exhibit an acid amplifier-like behavior.

A photobase generator (PBG) generates a base upon exposure to radiation. Photobase generators include quaternary ammonium dithiocarbamates, alpha aminoketones, oxime-urethane containing molecules such as dibenzophenone-oxime hexamethylene diurethane, ammonium tetraorganylborate salts, N-(2-nitrobenzyloxycarbonyl)cyclic amines, and combinations thereof.

A photo-destructible base (PDB) is a base that by exposure to radiation is converted into a species that does not interfere with an acid. For example, triphenylsulfonium hydroxide (TPSH), upon exposure, is converted into water and neutral organic species.

A thermal base generator (TBG) forms a base upon heating above a first temperature, T. T can be a temperature of about 140° C. or greater, such as 140° C. to 260° C. The thermal base generator can comprise a functional group selected from the group consisting of amide, sulfonamide, imide, imine, O-acyl oxime, benzoyloxycarbonyl derivative, quarternary ammonium salt, nifedipine, carbamate, and combinations thereof. Exemplary thermal base generators include o-{(.beta.-(dimethylamino)ethyl)aminocarbonyl}benzoic acid, o-{(.gamma.-(dimethylamino)propyl) aminocarbonyl}benzoic acid, 2,5-bis{(.beta.-(dimethylamino)ethyl)aminocarbonyl}terephthalic acid, 2,5-bis {(.gamma.-(dimethylamino)propyl) aminocarbonyl}terephthalic acid, 2,4-bis{(.beta.-(dimethylamino)ethyl)aminocarbonyl}isophthalic acid, 2,4-bis {(.gamma.-(dimethylamino)propyl) aminocarbonyl}isophthalic acid, and combinations thereof.

The photoresist composition can further comprise a surfactant. Surfactants can be used to improve coating uniformity, and can include ionic, non-ionic, monomeric, oligomeric, and polymeric species, or combinations thereof. Examples of possible surfactants include fluorine-containing surfactants such as the FLUORAD series available from 3M Company in St. Paul, Minn., and siloxane-containing surfactants such as the SILWET series available from Dow Chemical.

The photoresist composition can include an organic solvent to dissolve the other components, so that the photoresist can be disposed evenly on the surface of the substrate to provide a defect-free coating. Non-limiting examples of organic solvents for the photoresist composition include ethers, glycol ethers, aromatic hydrocarbons, ketones, esters, ethyl lactate, gamma-butyrolactone, cyclohexanone, ethoxyethylpropionate (EEP), a combination of EEP and gamma-butyrolactone (GBL), propylene glycol methyl ether acetate, and mixtures thereof. The organic solvent for the photoresist composition can include the above-described organic casting solvent for the SA material or the second organic solvent used to remove the treated photoresist.

Exemplary base quenchers comprise aliphatic amines, aromatic amines, carboxylates, hydroxides, or combinations thereof. For example, base quenchers can include: dimethylamino pyridine, 7-diethylamino-4-methyl coumarin (Coumarin 1), tertiary amines, sterically hindered diamine and guanidine bases such as 1,8-bis(dimethylamino)naphthalene (PROTON SPONGE), berberine, or polymeric amines. Tetraalkyl ammonium hydroxides or cetyltrimethyl ammonium hydroxide can be used as a base quencher when the PAG is an onium salt.

Sensitizers include polycyclic aromatics such as pyrene, perylene, bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, 1,1-bis(4-hydroxyphenyl)cyclohexane, and combinations thereof.

The photoresist composition can comprise about 1% by weight (wt. %) to about 30 wt. % of photoresist based on the total weight of the photoresist composition, more particularly about 2 wt. % to about 15 wt. %.

The photoresist composition can comprise from about 0.5 wt. % to about 20 wt. % of a photoacid generator based on the weight of the photoresist in the photoresist composition, more particularly from about 0.5 wt. % to about 10 wt. % based on the weight of the photoresist in the photoresist composition.

The photoresist composition can comprise from about 0.01 wt. % to about 20 wt. % thermal acid generator based on the weight of the photoresist in the photoresist composition, more particularly from about 0.1 wt. % to about 10 wt. %.

The photoresist composition can comprise from about 0.01 wt. % to about 20 wt. % acid amplifier based on the weight of the photoresist in the photoresist composition, more particularly from about 0.1 wt. % to about 10 wt. %.

The photoresist composition can comprise from about 0.01 wt. % to about 20 wt. % photobase generator based on the weight of the photoresist in the photoresist composition, more particularly from about 0.1 wt. % to about 10 wt. %.

The photoresist composition can comprise from about 0.01 wt. % to about 20 wt. % thermal base generator based on the weight of the photoresist in the photoresist composition, more particularly from about 0.1 wt. % to about 10 wt. %.

The photoresist composition can comprise from about 0.01 wt. % to about 20 wt. % photo-destructible base based on the weight of the photoresist in the photoresist composition, more particularly from about 0.1 wt. % to about 10 wt. %.

The photoresist composition can further include about 0.001 wt. % to about 0.1 wt. % of surfactant based on the total weight of photoresist in the photoresist composition.

The photoresist composition can comprise from about 70 wt. % to about 99 wt. % solvent based on the total weight of the photoresist composition, more particularly from about 85 wt. % to about 98 wt. %.

The photoresist composition can further include about 0.1 wt. % to about 1.0 wt. % of base quencher based on the total weight of the photoresist in the photoresist composition.

The photoresist composition can comprise from about 0.1 wt. % to about 30 wt. % sensitizer based on the weight of the photoresist in the photoresist composition, more particularly from about 0.1 wt. % to about 20 wt. %.

The photoresist layer can be formed by processes such as spin coating (also referred to as spin casting), spray coating, dip coating, doctor blading, roll coating, and the like, which can be used individually or in combinations thereof in accordance with the methods of the present invention. More particularly, a solution of the photoresist in a suitable solvent is spin coated onto the surface of the substrate, followed by removal of the solvent to produce the photoresist layer. In general, the photoresist layer can have a thickness of 100 to 10000 angstroms, more particularly 200 to 5000 angstroms, and even more particularly 300 to 3000 angstroms. For graphoepitaxy, the trench feature of the patterned photoresist layer can have a height of 100 to 10000 angstroms, more particularly 300 to 3000 angstroms, and even more particularly 500 to 1500 angstroms. For chemical epitaxy, the trench can have a height of 10 to 500 angstroms, more particularly 15 to 300 angstroms, and even more particularly 15 to 200 angstroms. The photoresist layer can be heated in what is termed a post-apply bake at a temperature of 50° C. to 300° C., more particularly 50° C. to 200° C., for a period of 1 sec to 1 hour, more particularly 1 sec to 5 minutes.

Pattern-wise exposure of the photoresist layer can be accomplished using radiation of various types, including ultraviolet (UV) radiation of wavelengths from 450 nm to 300 nm, deep ultraviolet (DUV) radiation of wavelengths from 300 nm to 120 nm, extreme ultraviolet (EUV) radiation of wavelengths from 120 nm to 4 nm, electron-beam (e-beam) radiation, x-ray radiation, and combinations of the foregoing. DUV and EUV exposures employ a specific mask to generate patterns in the positive-tone photoresist layer. E-beam lithography writes patterns directly to the photoresist. Exemplary radiation sources include single wavelength and/or narrow band radiation sources, specific mercury emission lines, lasers, and particle beam emitters. For less stringent conditions, a broad band multiple wavelength source can be used. More particularly, the radiation wavelength is selected from the group consisting of 436 nm, 405 nm, 365 nm, 334 nm, 313 nm, 257 nm, 248 nm, 193 nm, 157 nm, 126 nm, and 13.5 nm. Even more particularly, the wavelength of the radiation is selected from the group consisting of 248 nm, 193 nm, 157 nm, and 13.5 nm. Still more specifically, the wavelength of the radiation for the pattern-wise exposure can be 193 nm. The pattern-wise exposure at 193 nm can be performed either dry or under immersion conditions. In particular, the pattern-wise exposure can be accomplished by 193 nm water-immersion lithography. In order to accommodate patterning by 193 nm water-immersion lithography, a protective topcoat layer can be applied to the surface of the photoresist prior to exposure via immersion lithography. Preferably, the topcoat layer is base-soluble and is removed during the photoresist development step by the alkaline photoresist developer. Alternatively, the photoresist can comprise surface-active components that control the surface properties of the coated photoresist and limit the extraction of photoresist components into the immersion fluid.

The pattern-wise exposed photoresist layer can be developed with a non-alkaline developer, more particularly an organic solvent, and even more particularly an organic solvent of moderate polarity. Using a positive-tone photoresist and negative-tone development, a patterned photoresist layer is formed by selectively removing the non-exposed photoresist with the non-alkaline developer. The patterned photoresist layer is disposed on a first surface of the substrate. A second surface of the substrate has substantially no photoresist disposed thereon. In an embodiment, the second surface has no photoresist disposed thereon. The surface properties of the second surface that are critical to directing self-assembly of the SA material are not substantially altered by the lithographic process that includes exposure, development and any optional pre- or post-development bake. For comparison, a typical positive-tone process subjects the underlying surface in the regions of interest to deep UV radiation, super acids at high temperatures during a post-exposure bake, reactive intermediates from photoresist deprotection fragments, and alkaline conditions during photoresist development. In addition, residual photoresist material remaining on the underlayer after development can interfere with the SA process. Even if all the photoresist material is successfully removed in the desired regions, the underlying surface can also be exposed to deep UV radiation, chemical freeze materials, or surface-curing agents used to render the positive-tone photoresist pattern insoluble in organic casting solvents. All of these processes and materials typically alter surface properties of the substrate and, thereby, can disrupt the subsequent self-assembly process. For example, the substrate having a top affinity control layer comprising grafted PS-r-PMMA random copolymer can support perpendicular orientation of PS/PMMA domains from a PS-b-PMMA block copolymer. However, PS-b-PMMA block copolymer does not form perpendicularly oriented PS/PMMA domains on the PS-r-PMMA surface that has been contacted by a photoacid or aqueous base developer. As a result, the designed DSA cannot be performed because of the damage to the substrate affinity control layer. The present methods overcome these limitations by selectively removing the non-exposed photoresist using the non-alkaline developer to uncover the undamaged substrate surface.

The non-alkaline developer can comprise an organic solvent suitable for casting the SA material. In an embodiment, the non-alkaline developer comprises the same organic solvent used to cast the SA material. Exemplary organic solvents include anisole, ethylene glycol, propylene glycol, and 4-methyl-2-pentanol, n-butyl acetate, and mixtures thereof. The non-alkaline developer can also be a supercritical fluid, such as liquefied methane, liquefied ethane, liquefied propane, or liquefied carbon dioxide. The non-alkaline developer comprising supercritical fluids can further comprise additional components including organic solvents, surfactants, and salts in order to modify various properties of the developer.

An optional post-development bake can further tailor the solvent compatibility of the patterned photoresist layer. The bake can be conducted at a temperature from 50° C. to 300° C. for a period ranging from 1 sec to 1 hour.

SA materials are comprised of immiscible materials that can phase segregate into domains. Phase segregation can be found in different types of polymer blends (e.g., binary, ternary) as well as block copolymers comprising two or more different polymeric block components.

SA materials for directed self-assembly can comprise immiscible polymer blends. The term "immiscible" as used herein refers to two or more polymers in the polymer blend being incompatible enough to drive phase segregation under certain process conditions. The immiscibility of the polymers in the polymer blends can depend on the composition as well as the film forming process of the polymer blends. The ratio of the polymers, molecular weight of the individual polymers in the blend, and the presence of other additional components in the blend can be used to adjust the compatibility of the polymers in the polymer blend. Temperature, coating conditions, topography and geometry of the patterned photoresist layer, patterned photoresist layer surface properties, and substrate surface properties can also affect the phase segregation of the polymers. As used herein, an "immiscible polymer" is a polymer that in a polymer blend composition phase segregates on a properly prepared substrate surface under appropriate process conditions.

Examples of polymers for the two or more immiscible polymers include: cellulose, poly(acrylamide), polyethyleneimine, poly(acrylic acid), poly(2-ethyl-2-oxazoline), poly(ethyleneoxide), and poly(vinyl alcohol), novolac resins, cresol resins, poly(hydroxystyrene), poly(acrylic acid), poly(styrene sulfonic acid), poly(vinyl phosphoric acid), poly(vinyl sulfonic acid), poly(2-sulfoethyl methacrylate), poly(2-sulfopropyldimethyl-3-methacrylamide), poly(1,1,1-trifluoro-2-(trifluoromethyl)-2-hydroxy-pentan-4-yl methacrylate), fluoro alcohol-based polymers, poly(2-ethyl-trifluoromethanesulfonamide methacrylate), acidic sulfonamide polymers, poly(styrene), poly(hydroxyadamantyl methacrylate), poly(isobornyl methacrylate), poly(phenyl methacrylate), poly(vinyl naphthalene), polysiloxanes, polymethylsilsesquioxanes, polycarbosilanes, poly(vinyl ferrocene), poly(acylonitrile), poly(caprolactone), poly(lactide), poly(methyl methacrylate), poly(2-hydroxyethyl methacrylate), poly(gamma-butyrolactone methacrylate), poly(tetrahydrofuranyl methacrylate), poly(tetrahydropyranyl methacrylate), poly(allyl amine), poly(4-aminostyrene), poly(2-dimethylaminoethyl methacrylate), polyethyleneneimine, poly(N-methylvinylamine), poly(vinyl pyridine), poly(isoprene), poly(butadiene), poly(nobornene), poly(ethylene), poly(propylene), poly(1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic fluoro sulfonamide polymers, poly(2,2,2-trifluoroethyl methacrylate), poly(hexafluoroisopropyl methacrylate), poly(2,3,4,5,6-pentafluoro styrene), and substituted derivatives thereof. The two or more immiscible polymers can be selected such that each polymer is immiscible with each other polymer in the blend.

The SA material can comprise a block copolymer, or blends of block copolymers and other polymers. In an embodiment, the block copolymer consists essentially of a first polymeric block component A and a second polymeric block component B that are immiscible with each other. Typically, homopolymers of suitable immiscible block components form a blend that exhibits multiple glass transition temperatures representing each homopolymer phase. Preferably, one of the components A and B is selectively removable without having to remove the other, so as to form either isolated and orderly arranged structural units composed of the un-removed component, or a continuous structural layer containing isolated and orderly arranged cavities formed after the removable component has been removed. Alternatively, the components A and B can simply have different electrical, optical, and/or magnetic properties, so that the ordered patterns composed of such components A and B can be used for fabricating different device structures.

The block copolymer can comprise blocks comprising one or more monomers, and at least two blocks in the block copolymer are compositionally, structurally, or both compositionally and structurally non-identical. Suitable block copolymers include di-block copolymers, tri-block copolymers, or multi-block copolymers, any of which can be used in conjunction with DSA to further enhance the resolution. The blocks themselves can be homopolymers, or copolymers, including terpolymers. The SA material can comprise an amphiphilic organic block copolymer, amphiphilic inorganic block copolymer, organic di-block copolymer, organic multi-block copolymer, inorganic-containing di-block copolymer, inorganic-containing multi-block copolymer, linear block copolymer, star block copolymer, dendritic block copolymer, hyperbranched block copolymer, graft block copolymer, or a combination comprising at least one of the foregoing block copolymers. In an embodiment, the block copolymer is a di-block copolymer. Combining a suitable tri-block copolymer or multi-block and a chemical pre-pattern can, for example, be used to multiply the spatial frequency of the chemical pre-pattern.

The block components can in general be any appropriate microdomain-forming block that can be copolymerized with, attached to, or self-organize with another dissimilar block. Blocks can be derived from different polymerizable monomers, where the blocks can include but are not limited to: polyolefins including polydienes, polyethers including poly (alkylene oxides) such as poly(ethylene oxide), poly(propylene oxide), poly(butylene oxide), or random or block copolymers of these; poly((meth)acrylates), polystyrenes, polyesters, polyorganosiloxanes, polyorganogermanes, and the like.

In an embodiment, the blocks of the block copolymer comprise repeating units derived from $C_{2-30}$ olefinic monomers, (meth)acrylate monomers derived from $C_{1-30}$ alcohols, inorganic-containing monomers including those based on Fe, Si, Ge, Sn, Al, Ti, or a combination comprising at least one of the foregoing monomers. In a specific embodiment, exemplary monomers for use in the blocks can include, as the $C_{2-30}$ olefinic monomers, ethylene, propylene, 1-butene, 1,3-butadiene, isoprene, vinyl acetate, dihydropyran, norbornene, maleic anhydride, styrene, 4-hydroxy styrene, 4-acetoxy styrene, 4-methylstyrene, or alpha-methylstyrene; and can include as (meth)acrylate monomers, methyl(meth)acrylate, ethyl(meth)acrylate, n-propyl(meth)acrylate, isopropyl (meth)acrylate, n-butyl(meth)acrylate, isobutyl(meth)acrylate, n-pentyl(meth)acrylate, isopentyl(meth)acrylate, neo-pentyl(meth)acrylate, n-hexyl(meth)acrylate, cyclohexyl (meth)acrylate, isobornyl(meth)acrylate, or hydroxyethyl (meth)acrylate. Combinations of two or more of these monomers can be used. Exemplary blocks that are homopolymers include blocks prepared using styrene (i.e., polystyrene blocks), or (meth)acrylate homopolymeric blocks such as poly(methyl methacrylate); exemplary random blocks include, for example, blocks of styrene and methyl methacrylate (e.g., poly(styrene-co-methyl methacrylate)), randomly copolymerized; and an exemplary alternating copolymer block can include blocks of styrene and maleic anhydride which is known to form a styrene-maleic anhydride dyad repeating structure due to the inability of maleic anhydride to homopolymerize under most conditions (e.g., poly(styrene-alt-maleic anhydride)) where "-alt-" indicates alternating polymeric blocks. It is understood that such blocks are exemplary and should not be considered to be limiting.

More specific di-block or tri-block copolymers include poly(styrene-b-vinyl pyridine) (PS-b-PVP), poly(styrene-b-butadiene) (PS-b-PBD), poly(styrene-b-isoprene) (PS-b-PI), poly(styrene-b-methyl methacrylate) (PS-b-PMMA), poly (styrene-b-alkenyl aromatics), poly(isoprene-b-ethylene oxide) (PI-b-PEO), poly(styrene-b-(ethylene-propylene)), poly(ethylene oxide-b-caprolactone), poly(butadiene-b-ethylene oxide) (PBD-b-PEO), poly(styrene-b-t-butyl(meth) acrylate), poly(methyl methacrylate-b-t-butyl methacrylate), poly(ethylene oxide-b-propylene oxide), poly(styrene-b-tetrahydrofuran), poly(styrene-b-dimethylsiloxane) (PS-b-PDMS), poly(styrene-b-ferrocenyldimethylsilane) (PS-b-PFS), poly(styrene-b-isoprene-b-ethylene oxide) (PS-b-PI-b-PEO), poly(styrene-b-isoprene-b-methyl methacrylate) (PS-b-PI-b-PMMA), poly(styrene-b-ferrocendimethylsilane-b-isoprene) (PS-b-PFS-PI), or a combination comprising at least one of the foregoing block copolymers.

The polymer blend or block copolymers can also comprise inorganic constituents, including inorganic-containing homopolymers, copolymers, and block copolymers, and inorganic-containing monomers, molecules, and additives. These include, for example, those based on silicon, germanium, iron, titanium, aluminum, or the like. Exemplary silicon- and germanium-containing monomers and polymers can include those disclosed by H. Ito in "Chemical Amplification Resists for Microlithography" *Adv. Polym. Sci.*, vol. 172, pp. 37-245 (2005); exemplary metal containing monomers and polymers include those disclosed by Ian Manners in "Synthetic Metal-containing Polymers", Wiley-VCH, 2004; exemplary silicon-containing molecules and additives such as organosilicates include those disclosed by E. M. Freer, L. E. Krupp, W. D. Hinsberg, P. M. Rice, J. L. Hedrick, J. N. Cha, R. D. Miller, and H. C. Kim in "Oriented mesoporous organosilicate thin films", *Nano Letters*, vol. 5, 2014 (2005); and exemplary metal-containing molecules and additives include those disclosed by Jinan Chai, Dong Wang, Xiangning Fan, and Jillian M. Buriak, "Assembly of aligned linear metallic patterns on silicon", *Nature Nanotechnology*, vol. 2, p. 500, (2007).

The block copolymer desirably has an overall molecular weight and polydispersity amenable to further processing. In an embodiment, the block copolymer has a weight-averaged molecular weight ($M_w$) of 3,000 to 200,000 g/mol. Similarly, the block copolymer has a number averaged molecular weight ($M_n$) of 1,000 to 80,000. The block copolymer can also have a polydispersity ($M_w/M_n$) of 1.01 to 6, and is not particularly limited thereto. Molecular weight, both $M_w$ and $M_n$, can be determined by, for example, gel permeation chromatography using a universal calibration method, calibrated to polystyrene standards.

The block copolymers can be prepared by methods previously described in the art, including living polymerization techniques such as atom transfer free radical polymerization (ATRP), ring-opening metathesis polymerization (ROMP), and living cationic or living anionic polymerizations, for example.

In a particular embodiment, the block copolymer used for forming the self-assembled periodic patterns is PS-b-PMMA. The PS and the PMMA blocks in such a PS-b-PMMA block copolymer can have a total (summed over all blocks) number average molecular weight ($M_n$) ranging from about 5 kg/mol to about 300 kg/mol, with a total number average molecular weight from about 10 kg/mol to about 100 kg/mole being more typical. Each block can have a $M_n$ of 1 to 2199 kg/mol, more particularly 1 to 99 kg/mol.

The morphology (shape, dimension, orientation) of the self-assembled domains from block copolymer thin films is a function of composition (material, molecular weight, volume ratio of different blocks), annealing condition (temperature, environment, annealing time), the interface properties (polymer-air interface, polymer-substrate interface) as well as the defined geometry (film thickness, topography of the confinement). Therefore, by adjusting one or more parameters, the morphology can be adjusted to the need of specific applications.

In order to form the self-assembled features, the block copolymer can be first dissolved in a suitable organic solvent system to form a block copolymer solution, which can then be applied on the patterned photoresist layer to form a thin block-copolymer layer disposed thereon. Optionally annealing the thin block-copolymer layer can aid in the self-assembly process of the polymeric block components.

Directed self-assembly using the solvent-developed patterned photoresist layer is accomplished by first preparing a solution of the SA material in an organic solvent. In an embodiment, the SA material comprises at least one block copolymer. The organic solvent should fully dissolve all SA materials, but not dissolve the patterned photoresist layer. Non-limiting exemplary organic solvents for the SA material include substituted or unsubstituted aromatic hydrocarbons, substituted or unsubstituted aromatic ethers, substituted or unsubstituted aromatic alcohols, saturated monoalcohols comprising 5 to 20 carbons, glycols, ketones, glycol mono ethers, and glycol mono ether esters. In an embodiment, the organic solvent used to dissolve the SA material is a glycol, glycol mono ether, or glycol mono ether ester, or combinations thereof. More specific organic solvents for the SA material include but are not limited to toluene, xylene, mesitylene, diphenyl ether, di-(ethylhexyl)ether, ethylene glycol, propylene glycol, propylene glycol monomethyl ether acetate (PGMEA), ethyl lactate, propylene glycol monomethyl ether (PGME), 4-methyl-2-pentanol, n-butanol, n-butyl acetate, anisole, cyclohexanone, acetone, and combinations thereof. In an embodiment, the organic solvent for the SA material is ethylene glycol, propylene glycol, propylene glycol monomethyl ether acetate, propylene glycol monomethyl ether, 4-methyl-2-pentanol, or combinations thereof. The solution of SA material can have a concentration ranging from about 0.1 weight percent (wt. %) to about 10 wt. % SA material based on total weight of the solution. More particularly, the SA material is dissolved at a concentration ranging from about 0.5 wt. % to about 5 wt. %. In an embodiment, the solution of SA material comprises from about 0.5 wt. % to about 2 wt. % PS-b-PMMA block copolymer dissolved in anisole. The solution of SA material can optionally further comprise additional block copolymers, homopolymers, random copolymers, nanoparticles, surfactants and photoacid generators, photobase generators, thermal acid generators, thermal base generators, acid amplifiers, and photodestrucible bases.

The solution of SA material is cast onto the patterned photoresist layer followed by removal of the organic solvent to form a thin film of the SA material (i.e., SA layer) disposed on the patterned photoresist layer and the substrate surfaces uncovered by development. The solution of SA material can be cast onto the patterned photoresist layer by any suitable technique, including, but not limited to: spin coating, roll coating, spraying, ink coating, dip coating, and the like. Additional annealing (including thermal annealing, thermal gradient annealing, solvent vapor annealing or other gradient field) can be optionally employed to remove defects in the SA layer and/or promote self-assembly of the SA material. More particularly, the SA layer comprising a block copolymer is thermally annealed at a temperature that is above the glass transition temperature ($T_g$) of the block copolymer but below the decomposition or degradation temperature ($T_d$) of the block copolymer. The thermal annealing step can be carried out at an annealing temperature of about 100° C. to about 300° C. The thermal annealing can be performed for a period of more than 0 hours to about 100 hours, and more particularly for about 1 hour to about 15 hours. The thermally annealed block copolymer self-assembles to form ordered domains whose orientation can be perpendicular to the underlying surface plane. In general, the SA material can have a thickness of 100 to 10000 angstroms, more particularly 150 to 5000 angstroms, and even more particularly 200 to 3000 angstroms.

The difference in the etch rates between two ordered domain regions of the block copolymer allows the generation of additional patterns. Selectively removing by etching, solvent or other means, at least one self-assembled domain, creates a nano-scale relief pattern comprising, for example, a pattern of openings that can be transferred into the underlying substrate. Types of etching include any common etching applied in the manufacture of semiconductor devices, for example, dry-etching such as plasma etching, or wet-etching using selective solvents. Typically, dry etching processes are employed for etching at sub-50 nm dimensions. Prior to this pattern development/pattern transfer, the self-assembled layer of SA material can be optionally chemically modified to improve properties necessary for pattern transfer, such as etch resistance or mechanical properties.

Also disclosed are the layered structures formed using the above-described methods. In one embodiment, the layered structure is a semiconductor device. The semiconductor device comprises a substrate comprising an anti-reflection surface suitable for self-assembly of a block polymer; a developed patterned photoresist layer comprising radiation exposed, non-crosslinking, chemically amplified photoresist disposed on a first area of the anti-reflection surface; and a self-assembled domain pattern comprising the block polymer disposed on a second area of the anti-reflection surface having no photoresist thereon. The self-assembled domain pattern of the polymer can be in the form of a relief pattern comprising, for example, a pattern of openings derived by selective etching of a first domain of the domain pattern in the presence of a second domain of the domain pattern. In an embodiment, the block copolymer comprises a polystyrene block and a poly(methyl methacrylate) block.

The above-described methods permit a photoresist feature width of from 1 to 1000 nm, from 1 to 500 nm, from 1 to 300 nm, from 1 to 200 nm, from 1 to 150 nm, or more particularly from 1 to 100 nm. When the SA material is a block copolymer or blend containing a block copolymer, the methods advantageously allow domain patterns having reduced feature width and increased periodicity relative to the patterned photoresist layer. In this case, the domain feature width can be from 1 to 50 nm, from 1 to 30 nm, or more particularly from 1 to 20 nm. When the SA material is an immiscible polymer blend, the domain feature sizes tend to be larger, ranging from 1 to 500 nm, from 1 to 250 nm, or more particularly from 1 to 150 nm.

The methods are further illustrated by the following examples.

EXAMPLES

Materials used in the following examples are listed in Table 1.

TABLE 1

| Material | Description | Company |
| --- | --- | --- |
| AM2073J | positive-tone, non-crosslinking, 193 nm photoresist capable of chemical amplification | JSR |
| AR2928JN | positive-tone, non-crosslinking, 193 nm photoresist capable of chemical amplification | JSR |
| ARC-29A | antireflection material | Brewer Science |
| PS-b-PMMA (46k-21k) | Poly(styrene)-block-poly(methyl methacrylate); $M_n$ = 46k of the PS block; $M_n$ = 21k of the PMMA block; | Polymer source |
| PS-b-PMMA (37k-37k) | Poly(styrene)-block-poly(methyl methacrylate); $M_n$ = 37k of the PS block; $M_n$ = 37k of the PMMA block; | Polymer source |
| PS-b-PMMA (22k-22k) | Poly(styrene)-block-poly(methyl methacrylate); $M_n$ = 22k of the PS block; $M_n$ = 22k of the PMMA block; | Polymer source |
| PS-b-PMMA (18k-18k) | Poly(styrene)-block-poly(methyl methacrylate); $M_n$ = 18k of the PS block; $M_n$ = 18k of the PMMA block; | Polymer source |
| PS | Poly(styrene); $M_n$ = 22k | Polymer Source |
| P(BOCST-r-MMA) | poly(t-butyloxycarbonyloxystyrene-co-methyl methacrylate) random copolymer; $M_n$ = 54k; 248 nm/e-beam photoresist; | IBM (non-commercial) |
| P(S-r-EDCPMA) | poly(styrene-co-epoxydicyclopentadiene methacrylate) random copolymer, S:EDCPMA = 70:30 mol/mol, $M_n$ = 7k | IBM (non-commercial) |

Preparation of P(BOCST-r-MMA).

This random copolymer was prepared by free radical polymerization of t-butyloxycarbonyloxystyrene and methyl methacrylate under standard conditions. $M_n$=54 k.

Preparation of P(S-r-EDCPMA).

Poly(styrene-co-epoxydicyclopentadiene methacrylate) random copolymer was prepared by free-radical polymerization of styrene and epoxydicyclopentadiene methacrylate according to the method described in U.S. Pat. No. 7,521,090. $M_n$=7400 g/mol. PDI: 1.40

Preparation of Cross-Linked P(S-r-EDCPMA) Layer.

A layer of crosslinked P(S-r-EDCPMA) can be made by crosslinking P(S-r-EDCPMA) with a thermal acid generator or a photoacid generator. The details of composition and process condition are described in U.S. Pat. No. 7,521,090.

Example 1

A pre-pattern for graphoepitaxy was made by the following procedure. A solution comprising a 193 nm photoresist (JSR AM2073J) was spin coated onto a substrate having an anti-reflection top layer coating (780 angstroms of ARC-29A, Brewer Science) on silicon. The photoresist layer was baked at 110° C. for 60 sec and was pattern-wise exposed using 193 nm optical lithography. The exposed layer was developed with anisole to form a negative-tone topographical pre-pattern disposed on the anti-reflection layer. FIG. 8A is an atomic force microscopy (AFM) height image of the topography of the organic solvent-developed photoresist layer. A 1.5 wt. % (weight %) anisole solution, based on total weight of the solution, was prepared of a blend of block copolymer, PS-b-PMMA (46 k-21 k), and PS homopolymer ($M_n$=22 kg/mol). The PS-b-PMMA (46 k-21 k):PS dry blend weight ratio was 8:2. The solution was then spin coated at 3000 rpm onto the organic solvent-developed photoresist layer, the organic solvent was removed, and the resulting layer was baked at 200° C. for 1 minute, whereupon the PMMA formed cylinders within the PS matrix within the trenches of the patterned photoresist layer. The PMMA domains appear as parallel rows of brighter dots in the darker trench area of the photoresist pre-pattern, as shown in the AFM height image of FIG. 8B. The PMMA domains were then removed by oxygen reactive ion etching (RIE) to generate a pattern of holes as shown in the AFM height image of FIG. 8C. The pattern of holes appears as parallel rows of dark spots in FIG. 8C. The brighter area in FIG. 8C contains PS domains and photoresist.

Example 2

Figures 9A, 9B:
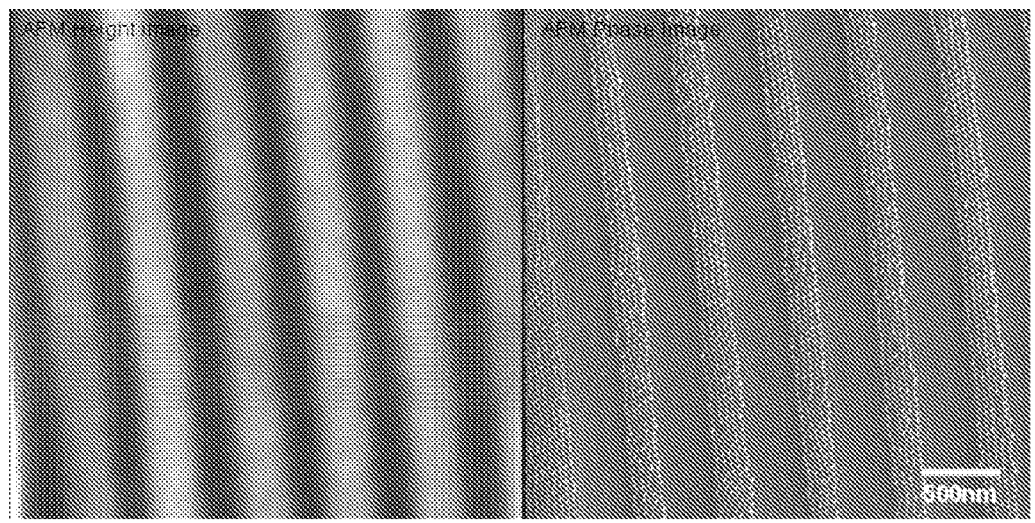
FIG. 9A is an AFM height image showing the layered structure of Example 2 after a layer of SA material, a polymer blend, is disposed on the photoresist pre-pattern.
FIG. 9B is an AFM phase image showing PMMA minority domains (bright spots) in the layered structure of Example 2.

A pre-pattern for graphoepitaxy was made by spin casting a layer of the 248 nm/e-beam photoresist P(BOCST-r-MMA), having a number average molecular weight $M_n$ of = 54 kg/mol, on a surface affinity control layer of cross-linked P(S-r-EDCPMA), $M_n$=7 kg/mol. The solution of P(S-r-EDCPMA) layer was disposed on a silicon wafer substrate. The P(BOCST-r-MMA) photoresist layer was exposed at 248 nm and negative-tone developed in anisole to produce a topographical pre-pattern. A 2 wt. % anisole solution, based on total weight of the solution, was prepared of a blend of block polymer, PS-b-PMMA (46 k-21 k), and PS homopolymer ($M_n$=22 kg/mol). The PS-b-PMMA (46 k-21 k):PS dry blend weight ratio was 8:2. The solution was then spin coated onto the organic solvent-developed photoresist layer. The organic solvent was removed to form the SA layer containing PS-b-PMMA (46 k-21 k) and PS layer. The SA layer was baked at 200° C. for 10 minutes to form minority domains of PMMA disposed in the trench area of the patterned photoresist layer. FIG. 9A is an AFM height image of the layered structure after the polymer blend film was disposed on the photoresist pre-pattern (dark parallel rows are the polymer blend in the trench of the pre-pattern). FIG. 9B is an AFM phase image showing the self-assembled PMMA minority domains (bright spots).

Example 3

Figure 10:
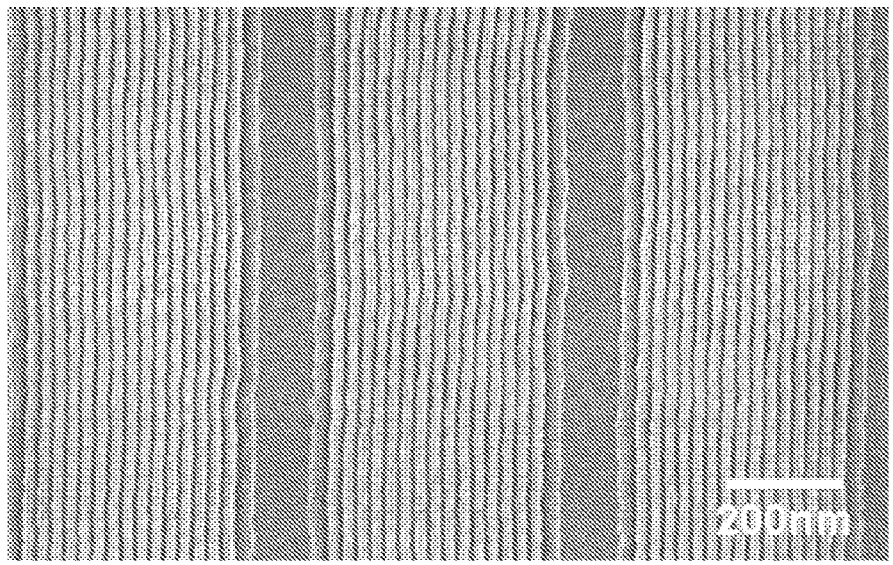
FIG. 10 is a scanning electron microscopy (SEM) image of the remaining polystyrene (PS) lines after removal of the poly(methyl methacrylate) (PMMA) domains and photoresist by oxygen plasma of Example 3.

A pre-pattern useful for graphoepitaxy was made by exposing a substrate having a 80 nm thick top layer of 193 nm photoresist (JSR AM2073J) disposed on a surface affinity control layer of cross-linked P(S-r-EDCPMA). The exposed photoresist layer was developed using anisole to form a negative-tone patterned photoresist layer, uncovering a surface of the P(S-r-EDCPMA) layer in the non-exposed region. A 2 wt. % anisole solution, based on total weight of the solution, was prepared of block copolymer, PS-b-PMMA (22 k-22 k). The solution was then spin coated onto the organic solvent-developed photoresist. The SA layer was baked at 200° C. for 5 minutes, whereupon the 50 nm thick PS-b-PMMA (22 k-22 k) film in contact with the uncovered surface affinity control layer of P(S-r-EDCPMA) self-assembled to form lamellar PS and PMMA domains oriented perpendicular to the surface affinity control layer and aligned parallel to the trenches. The PMMA domains and photoresist layer were then removed by oxygen plasma. FIG. 10 shows a scanning electron microscopy (SEM) image of the remaining PS lines (i.e., brighter parallel lines in FIG. 10).

Example 4

Figure 11A:
FIGS. 11A and 11B are AFM height and phase images, respectively, of the layered structure of Example 4 showing a self-assembled block copolymer in a thermally treated photoresist pattern after casting the block copolymer from PGMEA and annealing.
Figure 11B:
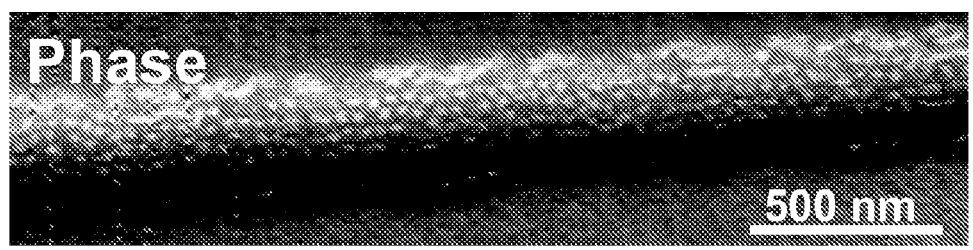
Figure 11C:
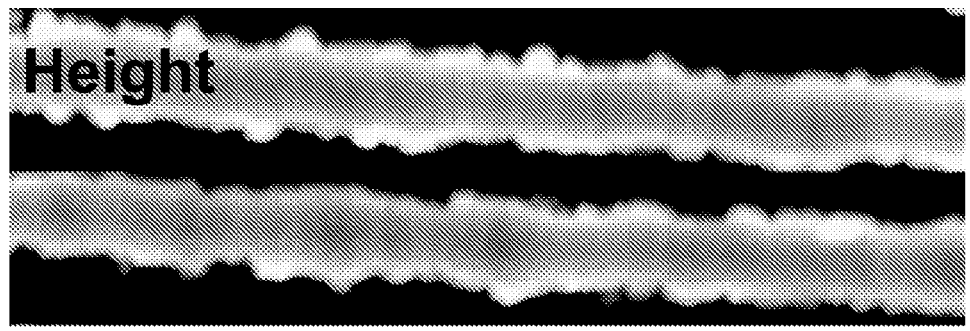
FIGS. 11C and 11D are AFM height and phase images, respectively, of the layered structure of Example 4 showing the self-assembled block copolymer after removing the thermally treated photoresist with alkaline tetramethylammonium hydroxide (TMAH).
Figure 11D:
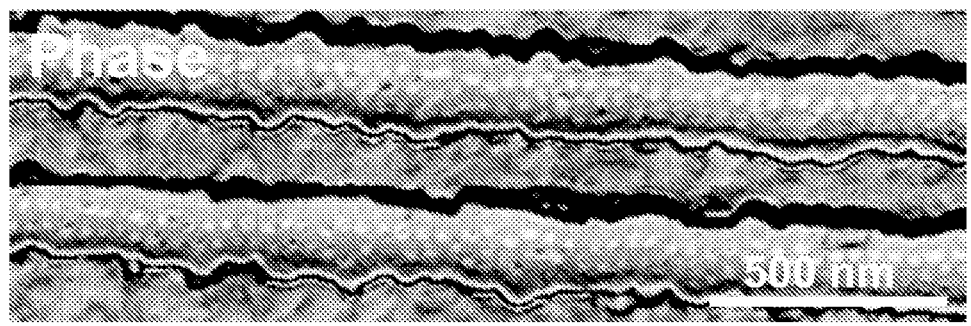

A pre-pattern useful for graphoepitaxy was made by pattern-wise exposing a 80 nm thick layer of 193 nm photoresist (JSR AM2073J) coated on a substrate comprising a surface affinity control top layer of cross-linked P(S-r-EDCPMA), as described above. The exposed photoresist layer was developed using anisole to form a negative-tone patterned photoresist layer, uncovering a surface of the P(S-r-EDCPMA) layer in the non-exposed region. The developed photoresist was then baked at 185° C. for 2 minutes, which was advantageously discovered to reduce photoresist solubility in PGMEA. A 1 wt. % PGMEA solution, based on total weight of the solution, was prepared of a blend of block copolymer, PS-b-PMMA (46 k-21 k) and PS (22 k) (weight ratio=8:2). The solution was then spin coated onto the organic solvent-developed photoresist. The SA layer was baked at 200° C. for 2 minutes, whereupon the polymer blend (PS-b-PMMA and PS 22 k) film in contact with the uncovered surface affinity control layer of P(S-r-EDCPMA) self-assembled to form cylindrical PMMA domains oriented perpendicular to the surface affinity control layer within a PS matrix. FIGS. 11A and 11B show an atomic force microscopy (AFM) height image and AFM phase image, respectively, of the self-assembled PMMA domains within the thermally treated photoresist trenches. The thermally treated photoresist did not dissolve in PGMEA and serves as a guiding pattern for self-assembled PS-b-PMMA/PS blend as shown in the AFM height image (FIG. 11A), where the brighter area is the SA treated photoresist and the darker area represents the SA blend within the photoresist trench. Directed self-assembled PMMA domains (white dots) are shown in the AFM phase image (FIG. 11B). After directed self-assembly step, the thermally treated patterned photoresist was removed by 0.26N tetramethylammonium hydroxide (TMAH, Air Products Optiyield CD) to leave self-assembled PMMA domains on the substrate as shown in the AFM height and phase images of FIGS. 11C and 11D respectively. In the AFM height image (FIG. 11C), the brighter area is the SA material, and the darker area indicates where the photoresist was removed. The AFM phase image (FIG. 11D) shows the self-assembled domains (dots) corresponding to the brighter region in the AFM height image (FIG. 11C).

Example 5

Figure 12A:
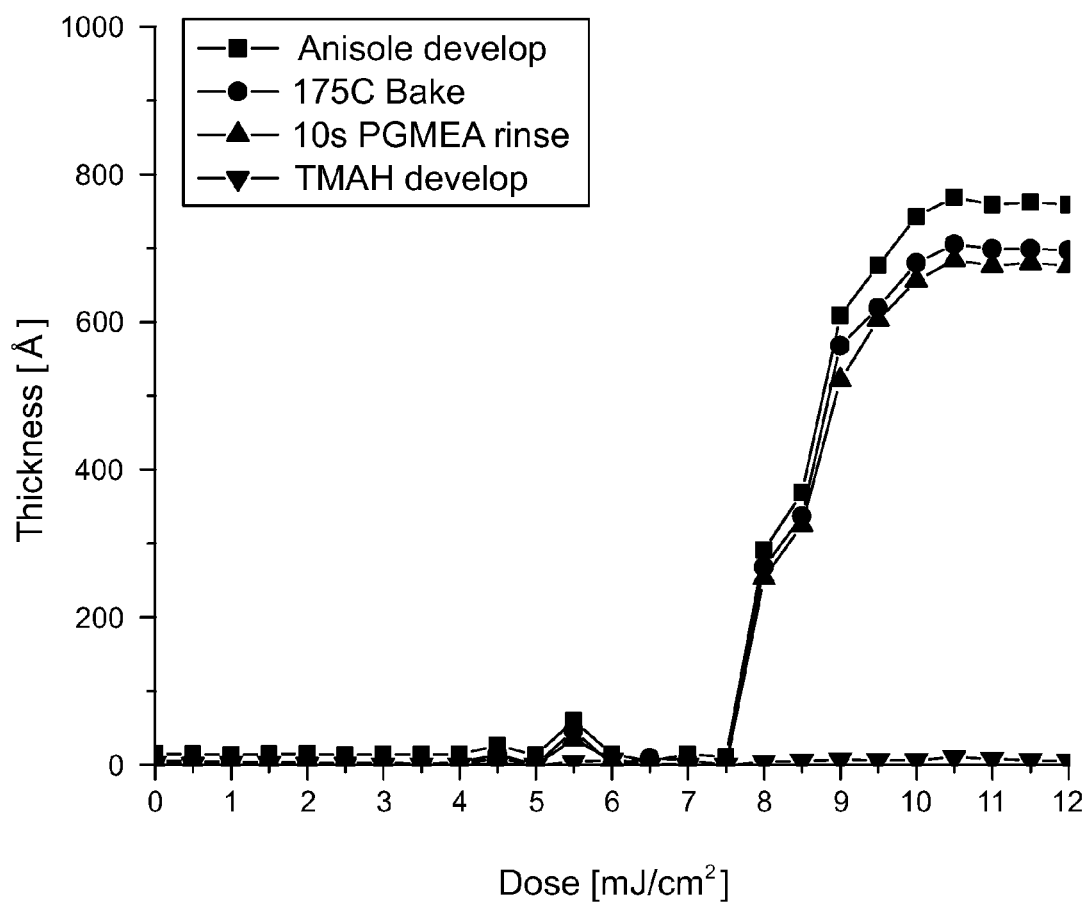
FIGS. 12A and 12B are graphs showing the effect on the solubility of a thermally treated, exposed photoresist layer in both PGMEA and in aqueous alkaline tetramethylammonium hydroxide (TMAH). The treated layer was prepared from 193 nm photoresist (JSR AR2928JN), exposed by 193 nm optical lithography, post-exposure baked at 115° C. for 60 sec, developed in anisole, and thermally treated by baking at 175° C. for 5 minutes (Example 5).
Figure 12B:
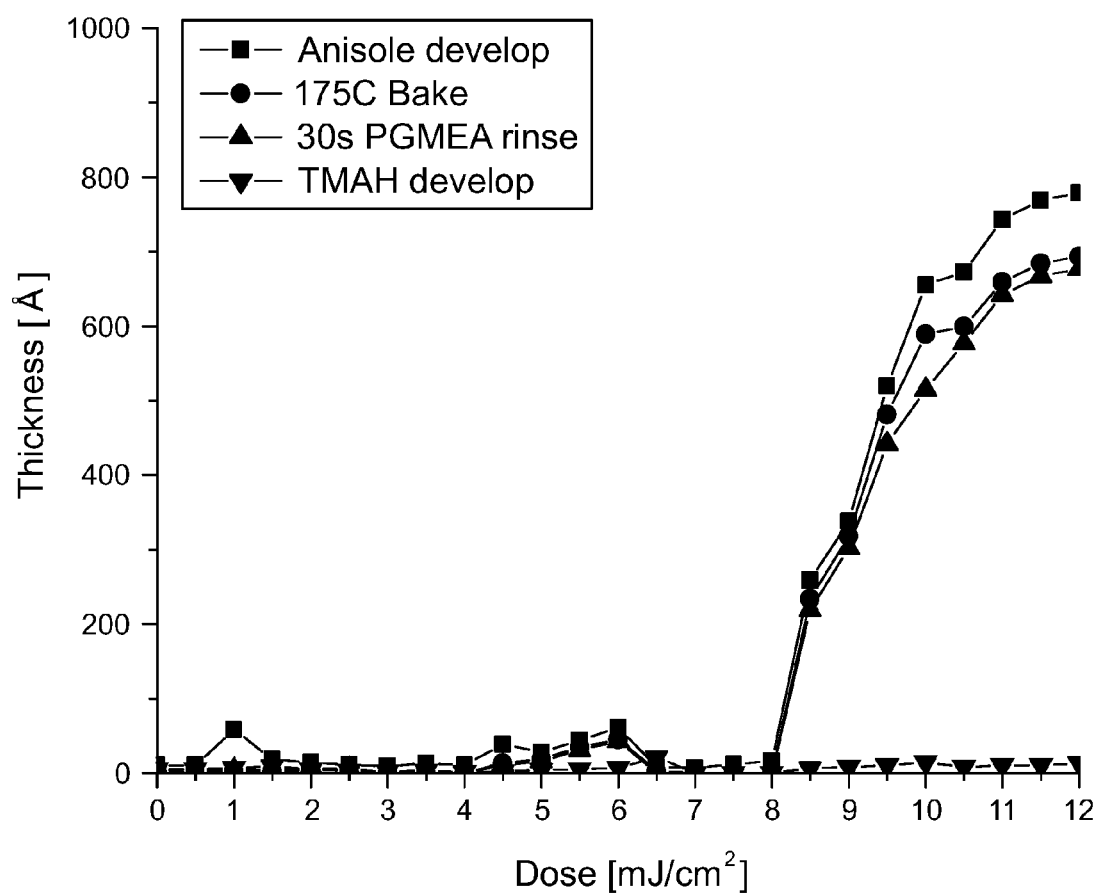

A solution comprising a 193 nm photoresist (JSR AR2928JN) was spin coated (2000 rpm for 30 s) onto a substrate having an anti-reflection top layer coating (780 angstroms of ARC-29A, Brewer Science) on silicon. The photoresist layer was baked at 120° C. for 60 sec. The photoresist was exposed to form an open field dose array using 193 nm optical lithography. The photoresist was subjected to a post-exposure bake at 115° C. for 60 sec. The photoresist was developed in anisole for 60 seconds and spun dry. The wafers were thermally treated by baking the wafers at 175° C. for 5 minutes. The wafers were placed on a spinner, puddled with propylene glycol monomethyl ether acetate (PGMEA) for a set period of time, and spun dry. The results for two PGMEA soak times, 10 sec and 30 sec, are shown in FIGS. 12A and 12B respectively. FIGS. 12A and 12B depict thickness of the developed photoresist layer in angstroms plotted against exposure dose in mJ/cm$^2$ after anisole development, after a post-development thermal treatment (labeled "175C Bake" in the legend), after 10 sec or 30 sec PGMEA rinse of the thermally treated photoresist, and after an aqueous tetramethylammonium hydroxide (TMAH) development of the thermally treated photoresist. As shown, little change in the thickness of the thermally treated photororesist was observed for PGMEA soak times of 10 and 30 seconds, indicating the thermal treatment rendered the post-developed photoresist insoluble in PGMEA. The thermally treated photoresist was nevertheless easily removed by a standard 60 second development process using aqueous tetramethylammonium hydroxide (TMAH).

Example 6

Figures 13A, 13B:
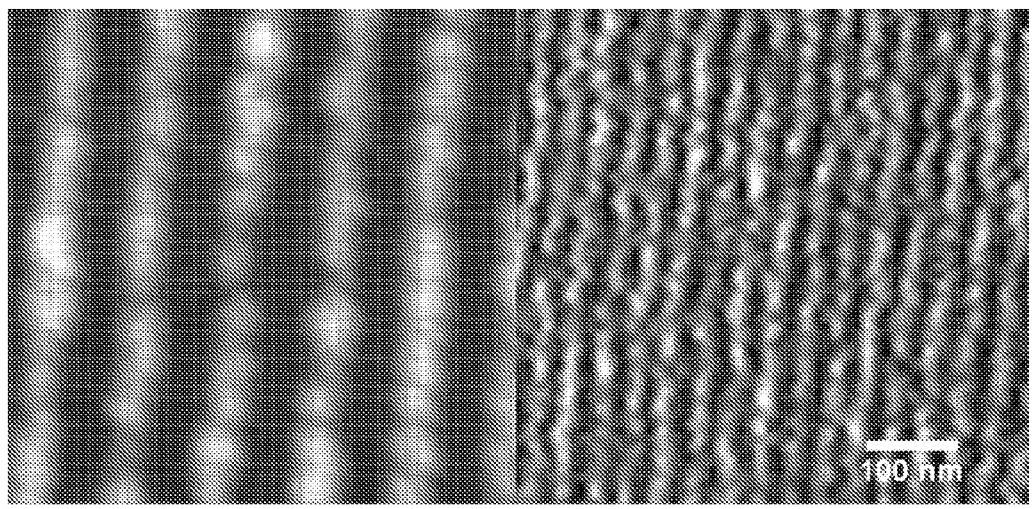
FIG. 13A is an AFM height image of the chemical pre-pattern formed in Example 6.
FIG. 13B is an AFM phase image of the line-space patterns from PS and PMMA domains obtained in Example 6 after casting the SA layer on the chemical pre-pattern.

A pre-pattern for chemical epitaxy was made by exposing a substrate containing a top layer of 20 nm thick 193 nm photoresist (JSR AR2928JN) disposed on a surface affinity control layer of cross-linked P(S-r-EDCPMA). The exposed photoresist was developed with anisole to create a negative-tone chemical pre-pattern comprising mesas of the thin organic solvent-developed photoresist pattern and the substrate surface comprising P(S-r-EDCPMA). The pre-pattern had a pitch of 90 nm as shown in AFM height image in FIG. 13A. A 1.5 wt. % anisole solution, based on total weight of the solution, was prepared of a blend of block copolymers, PS-b-PMMA (18 k-18 k) and PS-b-PMMA (37 k-37 k). The PS-b-PMMA (18 k-18 k):PS-b-PMMA (37 k-37 k) weight ratio was 9:1 in the dry blend. The solution was then spin coated onto the chemical pre-pattern. The SA layer was baked at 240° C. for 5 minutes to form PS and PMMA lamellar domains over the chemical pre-pattern. The location of PMMA domains are pinned by the stripes of the patterned photoresist. The PS and PMMA domains were oriented perpendicular to the P(S-r-EDCPMA) underlayer and aligned parallel to the stripes of the patterned photoresist. The lamellar lines have a pitch of 30 nm as shown in AFM phase image in FIG. 13B, triple the spatial frequency of the photoresist lines (pitch=90 nm) (FIG. 11A).

Example 7

Figure 14A:
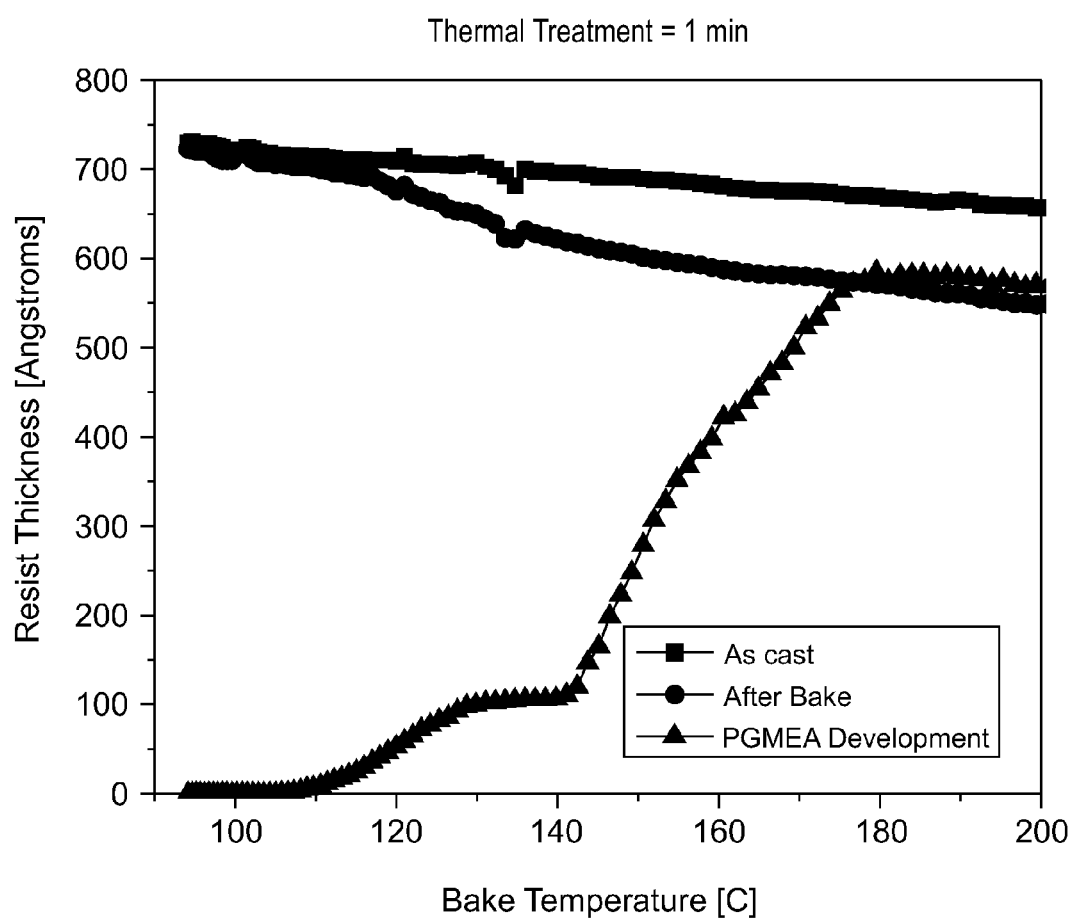
FIGS. 14A and 14B show the impact of a 1 minute and 5 minute thermal treatment on the thickness of exposed photoresist prior to and after a development process using PGMEA (Example 7). Treating the photoresist at higher bake temperatures is sufficient to render it insoluble in PGMEA.
Figure 14B:
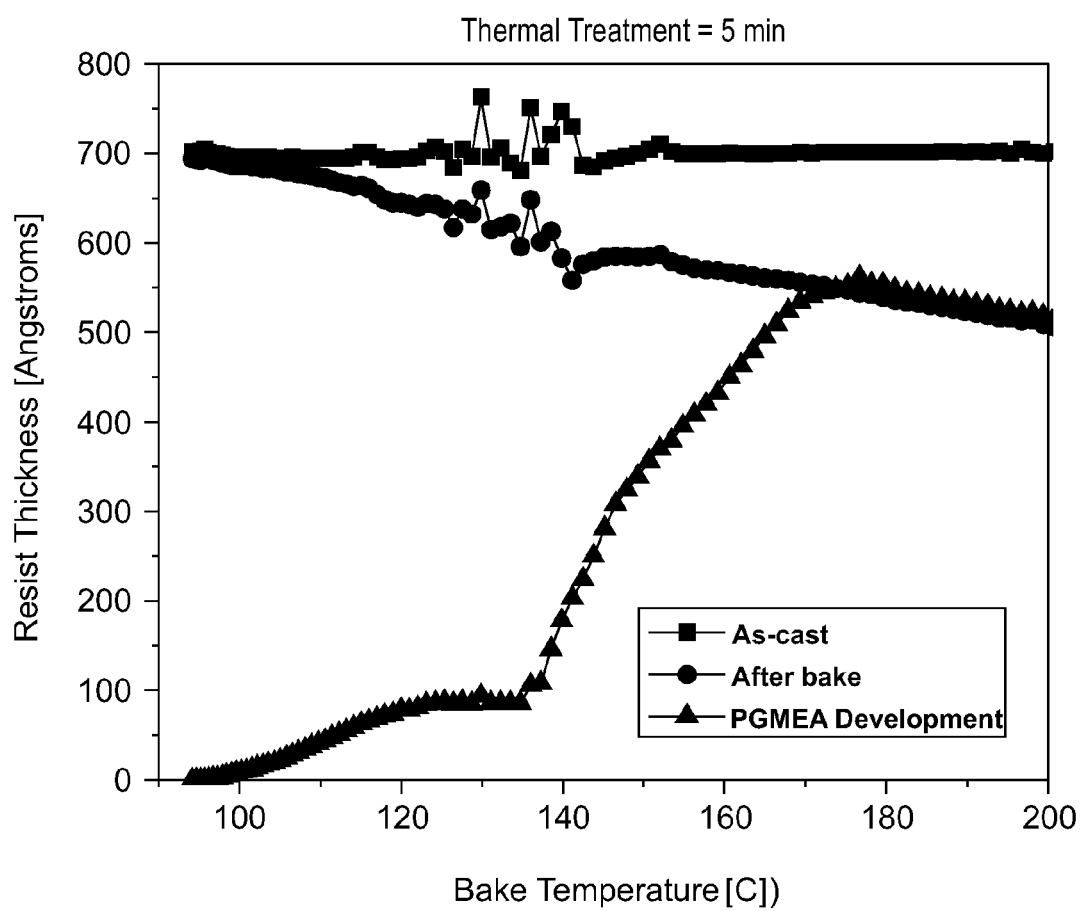

This experimental series demonstrates the effect of bake temperature for two different bake times (1 min and 5 min) on the solubility in PGMEA of a flood exposed photoresist layer. A solution comprising a 193 nm photoresist (JSR AR2928JN) was spin coated (3000 rpm for 30 s) onto a substrate having an anti-reflection top layer coating (780 angstroms of ARC-29A, Brewer Science) on silicon. This is designated the "As-cast" layer. The thickness of the photoresist layer was measured at 125 points across the "As-cast" wafer. The photoresist layer was given a post-application bake (PAB) for 60 sec at 120° C. The photoresist layer was then flood exposed with a broad band DUV source (a Hg/Xe 500 W short-arc lamp (UXM-501MA) from Ushio America) at a dose of 150 mJ/cm$^2$. The exposed wafer was then given a post-exposure bake (PEB) for 60 sec at 115° C. The wafer was then subjected to a thermal gradient heat treatment at temperatures ranging from 50° C. to 200° C. for 1 minute or 5 minutes using a thermal gradient hotplate. The thickness of the photoresist layer was measured at 125 points across the "After Bake" wafer and each thickness measurement was correlated with the corresponding temperature of the thermal gradient. The photoresist thickness decreases in roughly a linear relationship to the bake temperature likely due to evaporation (i.e., outgassing) of deprotection fragments and densification of the photoresist film. The results are shown as curves labeled "As-cast" and "After Bake" in FIGS. 14A and 14B. An "After Bake" wafer was developed in PGMEA for 60 sec and the remaining photoresist thickness was re-measured in the same manner. The results are shown as "PGMEA development" in FIGS. 14A and 14B. The results show that at a gradient temperature of about 180° C. and a heating time of 1 minute, no additional thickness loss in the photoresist layer is observed as a result of the PGMEA development process, which indicates that the film has become fully insoluble in PGMEA. Similarly, the exposed photoresist layer became insoluble in PGMEA at a treatment temperature of about 170° C. to 175° C. for a heating time of 5 minutes.

The above results show that the solubility of the exposed photoresist layer can be significantly reduced using a thermal treatment of 1 and 5 minutes at temperatures ranging from 90° C. to 200° C. Appropriate temperature/time conditions can be determined where no thickness change occurs between the "After Bake" (circles in FIGS. 14A and 14B) and "PGMEA development" curves (triangles in FIGS. 14A and 14B). The optimal thermal treatment conditions for temperature and heating time can depend on a number of factors including the exposure dosage, the photoresist formulation, and the radiation type (spectral bandwidth and intensity). In general, a thermal treatment at higher temperature allows for shorter heating times, whereas a longer heating time shifts the conditions to lower temperatures. These data are for bulk films and actual conditions necessary to render the photoresist insoluble in PGEMA may vary depending upon the size of the features being patterned; however, the thermal treatment results of Example 7 have, in general, been found to be predictive of the PGMEA solubility of a developed photoresist layer which has been given a post-development exposure and/or similar thermal treatment.

Comparative Example 1

Figures 15A, 15B, 15C:
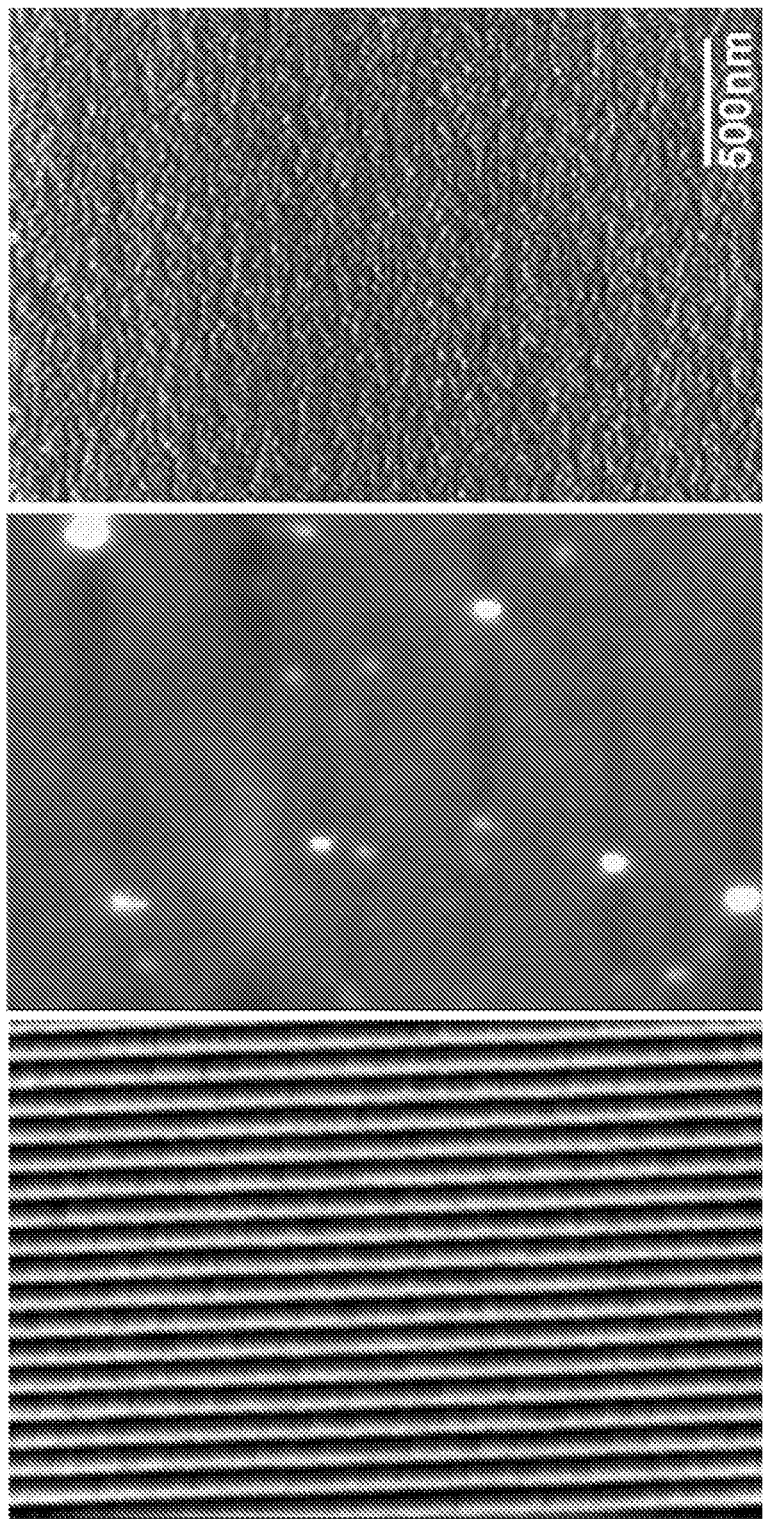
FIG. 15A is an AFM height image of the layered structure of Comparative Example 1 showing the photoresist layer before casting the SA material.
FIGS. 15B and 15C are AFM phase images of the layered structure of Comparative Example 1 showing the as-cast SA layer and the SA layer after baking, respectively, indicating the patterned photoresist layer was dissolved by the SA solvent.

If the exposed positive-tone photoresist is developed by standard developer (0.26N TMAH), the resulting non-crosslinked photoresist layer comprises non-exposed photoresist. The resulting photoresist layer will be dissolved during the application of the SA materials and will not direct the self-assembly. A topographical pre-pattern was made by exposing a stacked structure comprising a layer of 193 nm photoresist (JSR AR2928JN) on an anti-reflection coating as described above. The exposed portions of the photoresist are developed using standard 0.26N TMAH developer to produce a 100 nm pitch line-space (L/S) photoresist pattern shown in FIG. 15A (AFM height image). A 2 wt. % anisole solution of the block polymer PS-b-PMMA (46 k-21 k) was then coated onto the photoresist pattern, the organic solvent was removed to form the SA layer comprising PS-b-PMMA (46 k-21 k), and the SA layer was baked at 200° C. for 5 minutes. FIGS. 15B and 15C show AFM images of the as-cast and baked self-assembled polymers on the patterned photoresist surfaces. The patterned photoresist was dissolved while applying the solution of PS-b-PMMA (46 k-21 k) (FIG. 15B, AFM height image) and no self-assembled domains were guided by the photoresist topography (FIG. 15C, AFM phase image).

Comparative Example 2

If the exposed positive-tone photoresist is developed by one non-alkaline organic solvent, the photoresist pattern is not necessarily insoluble in a different non-alkaline organic solvent. If a proper organic casting solvent of SA material is not used, the organic solvent-developed photoresist pattern can be dissolved and does not serve as a good guiding pattern for polymer self-assembly. A topographical pre-pattern was made by exposing a substrate comprising a layer of 193 nm photoresist (JSR AR2928JN) on an anti-reflection coating (Shin-Etsu A940) as described above. The non-exposed portions of the photoresist were removed by development in anisole to form the 100 nm pitch line-spaced pre-pattern shown in FIG. 16A (AFM height image). A 2 wt. % PGMEA solution of the block polymer PS-b-PMMA (46 k-21 k) was then coated onto the patterned photoresist layer, the solvent was removed, and the resulting SA layer containing PS-b-PMMA (46 k-21 k) was baked at 200° C. for 5 minutes. FIG. 16B shows an AFM phase image of the baked SA layer on the photoresist topography. The photoresist topography was dissolved while applying the block copolymer from PGMEA, and there are no topography-directed self-assembled domains of the block copolymer.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof, unless stated otherwise.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming a layered structure comprising a domain pattern of a self-assembled material, the method comprising:

disposing on a substrate a photoresist layer comprising a non-crosslinking photoresist; optionally baking the photoresist layer; pattern-wise exposing the photoresist layer to first radiation; baking the exposed photoresist layer at a temperature of 170° C. to 200° C. for at least 1 minute; and developing the exposed and baked photoresist layer with a non-alkaline developer to form a negative-tone patterned photoresist layer comprising exposed non-crosslinked developed photoresist; wherein i) the developed photoresist is not soluble in a given organic solvent suitable for casting a given material capable of self-assembly, ii) the given organic solvent is selected from the group consisting of mono-alcohols, glycols, glycol mono ethers, glycol mono ether esters, and combinations thereof and iii) the developed photoresist is soluble in an aqueous alkaline developer and/or a second organic solvent, wherein the non-alkaline developer comprises the given organic solvent;

casting a solution comprising the given material capable of self-assembly dissolved in the given organic solvent on the patterned photoresist layer, and removing the given organic solvent; and allowing the casted given material to self-assemble while optionally heating and/or annealing the casted given material, thereby forming the layered structure comprising the domain pattern of the self-assembled given material.

2. The method of claim 1, wherein the photoresist undergoes chemical amplification.

3. The method of claim 1, wherein the self-assembled given material is disposed in a trench of the patterned photoresist layer, and has a thickness less than or equal to a height of the patterned photoresist layer.

4. The method of claim 1, wherein the self-assembled given material is disposed on a top surface of the patterned photoresist layer and on a substrate surface, and the self-assembled given material has a thickness greater than or equal to a height of a trench of the patterned photoresist layer.

5. The method of claim 1, further comprising selectively removing a first domain of the self-assembled given material, while leaving behind a second domain of the self-assembled given material, thereby forming a second layered structure comprising a relief pattern.

6. The method of claim 5, further comprising transferring the relief pattern to the substrate, thereby forming a third layered structure.

7. The method of claim 1, wherein pattern-wise exposure is performed by immersion lithography at 193 nm.

8. The method of claim 1, wherein the first radiation is extreme ultraviolet or e-beam.

9. The method of claim 1, wherein the given material capable of self-assembly comprises a polymer blend of two or more immiscible polymers.

10. The method of claim 1, wherein the given material capable of self-assembly comprises a block copolymer.

11. The method of claim 10, wherein the block copolymer is selected from the group consisting of poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl(meth)acrylate), poly(methyl methacrylate-b-t-butyl methacrylate), poly(ethylene oxide-b-propylene oxide), poly(styrene-b-tetrahydro furan), poly(styrene-b-dimethylsiloxane), poly(styrene-b-ferrocenyldimethylsilane), poly(styrene-b-isoprene-b-ethylene oxide), poly(styrene-b-isoprene-b-methyl methacrylate), poly(styrene-b-ferrocendimethylsilane-b-isoprene), and a combination comprising at least one of the foregoing block copolymers.

12. The method of claim 1 wherein the non-alkaline developer comprises an organic solvent selected from the group consisting of toluene, ethylene glycol, propylene glycol, propylene glycol monomethyl ether acetate, propylene glycol monomethyl ether, 4-methyl-2-pentanol, n-butyl acetate, anisole, acetone, and combinations thereof.

13. The method of claim 1, wherein the non-alkaline developer comprises a supercritical fluid.

14. The method of claim 1, wherein the substrate comprises an anti-reflection layer, and the non-crosslinking photoresist is disposed on the anti-reflection layer.

15. The method of claim 1, wherein the substrate comprises a top layer comprising a surface affinity control material selected from the group consisting of poly(epoxydicyclopentadiene methacrylate-co-styrene), poly(styrene-co-methyl methacrylate-co-expoxydicyclopentadiene methacrylate), poly(styrene-co-methyl methacrylate-co-glycidyl methacrylate), poly(styrene-co-methyl methacrylate-co-2-hydroxyethyl methacrylate), poly(styrene-co-methyl methacrylate-co-4-vinyl cinammate), poly(styrene-co-methyl methacrylate-co-vinyl benzocyclobutane), poly(styrene-co vinyl benzocyclobutane, poly(alpha-methyl styrene-co-methyl methacrylate), poly(methyl glutarimide), self-assembled monolayers, hydroxyl-terminated poly(styrene-co-methyl methacrylate), poly(styrene-co-methyl methacrylate-co-2-hydroxyethyl methacrylate), hydroxyl-terminated poly(styrene), hydroxyl-terminated poly(methyl methacrylate), poly(styrene-b-methyl methacrylate), and combinations thereof.

16. The method of claim 1, wherein the given organic solvent is selected from the group consisting of ethylene glycol, propylene glycol, propylene glycol monomethyl ether acetate (PGMEA), propylene glycol monomethyl ether (PGME), 4-methyl-2-pentanol, and combinations thereof.

17. The method of claim 1, wherein the given organic solvent is PGMEA.

18. The method of claim 1, wherein the non-alkaline developer and the given organic solvent are PGMEA.

19. A method of forming a layered structure comprising a relief pattern derived from a self-assembled polymer, the method comprising:

disposing on an anti-reflection surface of a substrate a photoresist layer comprising a non-crosslinking photoresist capable of chemical amplification; optionally baking the photoresist layer; pattern-wise exposing the photoresist layer to first radiation; optionally baking the exposed photoresist layer; and developing the exposed photoresist layer with a non-alkaline developer to form a negative-tone patterned photoresist layer comprising non-crosslinked exposed photoresist, wherein the exposed photoresist is soluble in a given organic solvent suitable for casting a given polymer capable of self-assembly, and the given organic solvent is selected from the group consisting of mono-alcohols, glycols, glycol mono ethers, glycol mono ether esters, and combinations thereof;

optionally, exposing the patterned photoresist layer to second radiation;

heating the patterned photoresist layer at a temperature of 165° C. to 200° C. for at least 1 sec, thereby forming a treated patterned photoresist layer comprising non-crosslinked treated photoresist, wherein the treated photoresist is not soluble in the given organic solvent suitable for casting the given polymer capable of self-assembly, and wherein the treated photoresist is soluble in an aqueous alkaline developer and/or a second organic solvent;

casting a solution of the given polymer dissolved in the given organic solvent on the treated patterned photoresist layer and removing the given organic solvent;

allowing the casted given polymer to self-assemble while optionally heating and/or annealing the casted given polymer, thereby forming a domain pattern of the self-assembled given polymer, the domain pattern comprising a first domain and a second domain; and selectively removing the first domain, while leaving behind a second domain of the self-assembled given polymer, thereby forming the layered structure comprising the relief pattern.

20. The method of claim 19, wherein heating the patterned photoresist layer is conducted at a temperature of 185° C. for 2 minutes.

21. The method of claim 19, wherein the patterned photoresist layer is exposed to the second radiation at a dose sufficient to induce a change in solubility of the treated photoresist in the given organic solvent.

22. The method of claim 19, further comprising transferring the relief pattern to the substrate, thereby forming a second layered structure comprising a pattern of altered regions in the substrate.

23. The method of claim 19, further comprising removing the treated photoresist from the layered structure with the aqueous alkaline developer after selectively removing the first domain.

24. A method of forming a layered structure having a relief pattern derived from a self-assembled block copolymer, the method comprising:

disposing on an anti-reflection surface of a substrate a photoresist layer comprising a non-crosslinking photoresist capable of chemical amplification; optionally baking the photoresist layer; pattern-wise exposing the photoresist layer to first radiation; baking the exposed photoresist layer; developing the photoresist layer with a non-alkaline developer to form a negative-tone patterned photoresist layer comprising non-crosslinked exposed photoresist, wherein the exposed photoresist is soluble in a given organic solvent suitable for casting a given block copolymer capable of self-assembly, and the given organic solvent is selected from the group consisting of mono-alcohols, glycols, glycol mono ethers, glycol mono ether esters, and combinations thereof;

heating the patterned photoresist layer at a temperature of 165° C. to 200° C. for at least 1 sec, thereby forming a treated patterned photoresist layer comprising non-crosslinked treated photoresist, wherein the treated photoresist is not soluble in the given organic solvent suitable for casting the given block copolymer capable of self-assembly, and the treated photoresist is soluble in an aqueous alkaline developer and/or a second organic solvent;

casting the given block copolymer dissolved in the given organic solvent on the treated patterned photoresist layer, and removing the given organic solvent;

allowing the casted given block copolymer to self-assemble while optionally heating and/or annealing the casted given block copolymer, to form a domain pattern of the self-assembled given block copolymer, the domain pattern comprising a first domain and a second domain; and selectively removing the first domain, while leaving behind the second domain, thereby forming the layered structure comprising the relief pattern.

25. The method of claim 24, wherein the relief pattern has a higher spatial frequency than the negative-tone patterned photoresist layer.

26. A method for creating a layered structure from a self-assembled polymer, comprising:

forming a layer of a non-crosslinking photoresist capable of chemical amplification on a substrate that includes a surface suitable for self-assembly of a polymer; pattern-wise exposing the photoresist with radiation, thereby forming an exposed photoresist layer; giving the exposed photoresist layer a post-exposure bake, thereby forming a baked layer, wherein the exposed portions of the photoresist are rendered insoluble in both a given non-alkaline developing solvent and a given casting solvent suitable for a given polymer capable of self-assembly, wherein the given casting solvent is selected from the group consisting of mono-alcohols, glycols, glycol mono ethers, glycol mono ether esters, and combinations thereof, wherein the non-alkaline developer comprises the given casting solvent;

selectively removing the photoresist in non-exposed regions using the given non-alkaline developing solvent, thereby forming a patterned photoresist layer comprising non-crosslinked exposed photoresist;

optionally, baking the patterned photoresist layer;

casting a solution of the given polymer dissolved in the given casting solvent on the patterned photoresist layer; removing the given casting solvent; and with optional annealing allowing the casted given polymer to self-assemble; and selectively removing a self-assembled domain of the given self-assembled polymer to form a relief pattern.

27. The method of claim 26, further comprising transferring the relief pattern to the substrate.

28. The method of claim 26, wherein the given non-alkaline developing solvent is an organic solvent.

29. The method of claim 26, wherein the developing solvent is selected from the group consisting of anisole, ethylene glycol, propylene glycol, 4-methyl-2-pentanol, toluene, propylene glycol monomethyl ether acetate, propylene glycol monomethyl ether, n-butyl acetate, acetone, and combinations thereof.

* * * * *